United States Patent
Simolon et al.

(10) Patent No.: US 9,948,878 B2
(45) Date of Patent: Apr. 17, 2018

(54) ABNORMAL CLOCK RATE DETECTION IN IMAGING SENSOR ARRAYS

(71) Applicant: FLIR Systems, Inc., Wilsonville, OR (US)

(72) Inventors: Brian Simolon, Santa Barbara, CA (US); Eric A. Kurth, Santa Barbara, CA (US); Jim Goodland, Santa Barbara, CA (US); Mark Nussmeier, Goleta, CA (US); Nicholas Hogasten, Santa Barbara, CA (US); Theodore R. Hoelter, Goleta, CA (US); Katrin Strandemar, Rimbo (SE); Pierre Boulanger, Goleta, CA (US); Barbara Sharp, Santa Barbara, CA (US); Naseem Y. Aziz, Goleta, CA (US)

(73) Assignee: FLIR SYSTEMS, INC., Wilsonville, OR (US)

( * ) Notice: Subject to any disclaimer, the term of this patent is extended or adjusted under 35 U.S.C. 154(b) by 0 days.

(21) Appl. No.: 14/961,829

(22) Filed: Dec. 7, 2015

(65) Prior Publication Data

US 2016/0224055 A1    Aug. 4, 2016

Related U.S. Application Data

(63) Continuation-in-part of application No. 14/106,666, filed on Dec. 13, 2013, now Pat. No. 9,207,708, (Continued)

(51) Int. Cl.
*G06F 11/07* (2006.01)
*G01R 23/00* (2006.01)
(Continued)

(52) U.S. Cl.
CPC .......... *H04N 5/3765* (2013.01); *G01R 23/00* (2013.01); *G06F 11/0703* (2013.01);
(Continued)

(58) Field of Classification Search
None
See application file for complete search history.

(56) References Cited

U.S. PATENT DOCUMENTS 4,906,944 A * 3/1990 Frerking .................. H03L 7/181
  331/1 A
5,331,208 A * 7/1994 Meyer .................. H03K 3/0232
  327/141
(Continued)

FOREIGN PATENT DOCUMENTS

| CN | 1913357 | 2/2007 |
|---|---|---|
| CN | 1941857 | 4/2007 |

(Continued)

OTHER PUBLICATIONS

Charles Kozierok, Hard-Wired vs. Programmable Logic, The PC Guide (Apr. 17, 2001), http://www.pcguide.com/ref/cpu/rootsProgrammable-c.html.*
(Continued)

*Primary Examiner* — Kim Huynh
*Assistant Examiner* — Kevin Stewart
(74) *Attorney, Agent, or Firm* — Haynes and Boone, LLP

(57) ABSTRACT

Various techniques are provided to detect abnormal clock rates in devices such as imaging sensor devices (e.g., infrared and/or visible light imaging devices). In one example, a device may include a clock rate detection circuit that may be readily integrated as part of the device to provide effective detection of an abnormal clock rate. The device may include a ramp generator, a counter, and/or other components which may already be implemented as part of the device. The ramp
(Continued)

generator may generate a ramp signal independent of a clock signal provided to the device, while the counter may increment or decrement a count value in response to the clock signal. The device may include a comparator adapted to select a current count value of the counter when the ramp signal reaches a reference signal. A processor of the device may be adapted to determine whether the clock signal is operating in an acceptable frequency range, based on the selected count value.

16 Claims, 16 Drawing Sheets

Related U.S. Application Data which is a continuation-in-part of application No. 14/101,245, filed on Dec. 9, 2013, which is a continuation of application No. PCT/US2012/041744, filed on Jun. 8, 2012, application No. 14/961,829, which is a continuation-in-part of application No. 14/099,818, filed on Dec. 6, 2013, which is a continuation of application No. PCT/US2012/041749, filed on Jun. 8, 2012, application No. 14/961,829, which is a continuation-in-part of application No. 14/101,258, filed on Dec. 9, 2013, which is a continuation of application No. PCT/US2012/041739, filed on Jun. 8, 2012, said application No. 14/106,666 is a continuation-in-part of application No. 13/437,645, filed on Apr. 2, 2012, now Pat. No. 9,171,361, which is a continuation-in-part of application No. 13/105,765, filed on May 11, 2011, now Pat. No. 8,565,547, and a continuation-in-part of application No. 12/766,739, filed on Apr. 23, 2010, now Pat. No. 8,520,970, said application No. 13/105,765 is a continuation of application No. PCT/EP2011/056432, filed on Apr. 21, 2011, and a continuation-in-part of application No. 12/766,739, filed on Apr. 23, 2010, now Pat. No. 8,520,970, said application No. PCT/EP2011/056432 is a continuation-in-part of application No. 12/766,739, filed on Apr. 23, 2010, now Pat. No. 8,520,970.

(60) Provisional application No. 61/793,181, filed on Mar. 15, 2013, provisional application No. 61/737,678, filed on Dec. 14, 2012, provisional application No. 61/656,889, filed on Jun. 7, 2012, provisional application No. 61/545,056, filed on Oct. 7, 2011, provisional application No. 61/495,873, filed on Jun. 10, 2011, provisional application No. 61/495,879, filed on Jun. 10, 2011, provisional application No. 61/495,888, filed on Jun. 10, 2011, provisional application No. 61/473,207, filed on Apr. 8, 2011, provisional application No. 61/748,018, filed on Dec. 31, 2012, provisional application No. 61/792,582, filed on Mar. 15, 2013, provisional application No. 61/793,952, filed on Mar. 15, 2013, provisional application No. 61/746,069, filed on Dec. 26, 2012, provisional application No. 61/746,074, filed on Dec. 26, 2012.

(51) Int. Cl.
| | | |
|---|---|---|
| H04N 5/376 | (2011.01) | |
| H04N 5/225 | (2006.01) | |
| H04N 5/33 | (2006.01) | |
| H04N 5/365 | (2011.01) | |
| G06F 1/04 | (2006.01) | |

(52) U.S. Cl.
CPC ......... *G06F 11/076* (2013.01); *H04N 5/2257* (2013.01); *H04N 5/33* (2013.01); *H04N 5/365* (2013.01); *G06F 1/04* (2013.01)

(56) References Cited

U.S. PATENT DOCUMENTS

| | | | |
|---|---|---|---|
| 5,982,318 | A | 11/1999 | Yiannoulos |
| 6,297,794 | B1 | 10/2001 | Tsubouchi et al. |
| 6,330,371 | B1 | 12/2001 | Chen et al. |
| 7,616,877 | B2 | 11/2009 | Zarnowski et al. |
| 7,620,265 | B1 | 11/2009 | Wolff et al. |
| 9,207,708 | B2 * | 12/2015 | Simolon ............ G06F 1/14 |
| 2002/0058352 | A1 | 5/2002 | Jacksen et al. |
| 2002/0109533 | A1 * | 8/2002 | Gregorian ........... H03K 5/08 327/99 |
| 2002/0162042 | A1 * | 10/2002 | Goodrich, III ....... H03L 7/16 713/500 |
| 2004/0211901 | A1 | 10/2004 | Syllaios et al. |
| 2007/0229126 | A1 | 10/2007 | Nam |
| 2008/0259181 | A1 | 10/2008 | Yamashita et al. |
| 2009/0303363 | A1 | 12/2009 | Blessinger |
| 2010/0020229 | A1 | 1/2010 | Hershey et al. |

FOREIGN PATENT DOCUMENTS

| | | |
|---|---|---|
| CN | 101127837 | 2/2008 |
| EP | 0973137 | 1/2000 |
| EP | 1983485 | 10/2008 |
| EP | 2136554 | 12/2009 |
| GB | 2411521 | 8/2005 |
| JP | 2003150451 | 5/2003 |
| JP | 2004/004465 | 1/2004 |
| JP | 2004/241491 | 8/2004 |
| JP | 2007/267035 | 10/2007 |
| JP | 2004004465 A | 1/2010 |
| KR | 20090088071 | 8/2009 |
| WO | WO 98/35212 | 8/1998 |
| WO | WO 98/54554 | 12/1998 |
| WO | WO2000/023814 | 4/2000 |
| WO | WO 2012/121526 | 9/2012 |

OTHER PUBLICATIONS

Gangkofner et al., "Optimizing the High-Pass Filter Addition Technique for Image Fusion," Photogrammetric Engineering & Remote Sensing, Sep. 2008, pp. 1107-1118, vol. 74, No. 9, American Society for Photogrammetry and Remote Sensing, Bethesda, MD, United States.

Ager et al., "Geo-positional accuracy evaluation of QuickBird Ortho-Ready Standard 2A multispectral imagery," Algorithms and Technologies for Multispectral, Hyperspectral, and Ultraspectral Imagery X, Aug. 12, 2004, pp. 488-499, vol. 5425, Proceedings of SPIE, Bellingham, WA, United States.

\* cited by examiner

ABNORMAL CLOCK RATE DETECTION IN IMAGING SENSOR ARRAYS

CROSS-REFERENCE TO RELATED APPLICATIONS

This application is a continuation-in-part of U.S. patent application Ser. No. 14/106,666 filed Dec. 13, 2013 and entitled "ABNORMAL CLOCK RATE DETECTION IN IMAGING SYSTEMS AND METHODS" which is hereby incorporated by reference in its entirety.

U.S. patent application Ser. No. 14/106,666 filed Dec. 13, 2013 claims the benefit of U.S. Provisional Patent Application No. 61/793,181 filed Mar. 15, 2013 and entitled "ABNORMAL CLOCK RATE DETECTION IN IMAGING SENSOR ARRAYS" which is hereby incorporated by reference in its entirety.

U.S. patent application Ser. No. 14/106,666 filed Dec. 13, 2013 claims the benefit of U.S. Provisional Patent Application No. 61/737,678 filed Dec. 14, 2012 entitled "ABNORMAL CLOCK RATE DETECTION IN IMAGING SENSOR ARRAYS" which is hereby incorporated by reference in its entirety.

U.S. patent application Ser. No. 14/106,666 filed Dec. 13, 2013 is a continuation-in-part of U.S. patent application Ser. No. 14/101,245 filed Dec. 9, 2013 and entitled "LOW POWER AND SMALL FORM FACTOR INFRARED IMAGING" which is hereby incorporated by reference in its entirety.

U.S. patent application Ser. No. 14/101,245 is a continuation of International Patent Application No. PCT/US2012/041744 filed Jun. 8, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/656,889 filed Jun. 7, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041744 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041744 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041744 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/099,818 filed Dec. 6, 2013 and entitled "NON-UNIFORMITY CORRECTION TECHNIQUES FOR INFRARED IMAGING DEVICES" which is hereby incorporated by reference in its entirety.

U.S. patent application Ser. No. 14/099,818 is a continuation of International Patent Application No. PCT/US2012/041749 filed Jun. 8, 2012 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041749 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041749 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/101,258 filed Dec. 9, 2013 and entitled "INFRARED CAMERA SYSTEM ARCHITECTURES" which is hereby incorporated by reference in its entirety.

U.S. patent application Ser. No. 14/101,258 is a continuation of International Patent Application No. PCT/US2012/041739 filed Jun. 8, 2012 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041739 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

U.S. patent application Ser. No. 14/106,666 is a continuation-in-part of U.S. patent application Ser. No. 13/437,645 filed Apr. 2, 2012 and entitled "INFRARED RESOLUTION AND CONTRAST ENHANCEMENT WITH FUSION" which is hereby incorporated by reference in its entirety.

U.S. patent application Ser. No. 13/437,645 is a continuation-in-part of U.S. patent application Ser. No. 13/105,765 filed May 11, 2011 and entitled "INFRARED RESOLUTION AND CONTRAST ENHANCEMENT WITH FUSION" which is hereby incorporated by reference in its entirety.

U.S. patent application Ser. No. 13/437,645 also claims the benefit of U.S. Provisional Patent Application No.

61/473,207 filed Apr. 8, 2011 and entitled "INFRARED RESOLUTION AND CONTRAST ENHANCEMENT WITH FUSION" which is hereby incorporated by reference in its entirety.

U.S. patent application Ser. No. 13/437,645 is also a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

U.S. patent application Ser. No. 13/105,765 is a continuation of International Patent Application No. PCT/EP2011/056432 filed Apr. 21, 2011 and entitled "INFRARED RESOLUTION AND CONTRAST ENHANCEMENT WITH FUSION" which is hereby incorporated by reference in its entirety.

U.S. patent application Ser. No. 13/105,765 is also a continuation-in-part of U.S. patent application Ser. No. 12/766,739 which is hereby incorporated by reference in its entirety.

International Patent Application No. PCT/EP2011/056432 is a continuation-in-part of U.S. patent application Ser. No. 12/766,739 which is hereby incorporated by reference in its entirety.

International Patent Application No. PCT/EP2011/056432 also claims the benefit of U.S. Provisional Patent Application No. 61/473,207 which is hereby incorporated by reference in its entirety.

U.S. patent application Ser. No. 14/106,666 claims the benefit of U.S. Provisional Patent Application No. 61/748,018 filed Dec. 31, 2012 and entitled "COMPACT MULTI-SPECTRUM IMAGING WITH FUSION" which is hereby incorporated by reference in its entirety.

U.S. patent application Ser. No. 14/106,666 claims the benefit of U.S. Provisional Patent Application No. 61/792,582 filed Mar. 15, 2013 and entitled "TIME SPACED INFRARED IMAGE ENHANCEMENT" which is hereby incorporated by reference in its entirety.

U.S. patent application Ser. No. 14/106,666 claims the benefit of U.S. Provisional Patent Application No. 61/793,952 filed Mar. 15, 2013 and entitled "INFRARED IMAGING ENHANCEMENT WITH FUSION" which is hereby incorporated by reference in its entirety.

U.S. patent application Ser. No. 14/106,666 claims the benefit of U.S. Provisional Patent Application No. 61/746,069 filed Dec. 26, 2012 and entitled "TIME SPACED INFRARED IMAGE ENHANCEMENT" which is hereby incorporated by reference in its entirety.

U.S. patent application Ser. No. 14/106,666 claims the benefit of U.S. Provisional Patent Application No. 61/746,074 filed Dec. 26, 2012 and entitled "INFRARED IMAGING ENHANCEMENT WITH FUSION" which is hereby incorporated by reference in its entirety.

TECHNICAL FIELD

One or more embodiments of the invention relate generally to imaging devices and more particularly, for example, to detecting clock rates of clock signals used by such devices.

BACKGROUND

Imaging sensor devices, such as infrared sensor arrays or visible light sensor arrays, may typically include various components whose timing may be dependent on clock signals to operate as intended, for example, to capture image frames at a specified frame rate. Thus, a clock signal used by an imaging sensor device may be required to operate at a frequency (e.g., clock rate) within an expected range to ensure correct operation of the imaging sensor device, to ensure compliance with relevant regulations (e.g., export control restrictions on the frame rate), and/or to prevent damage to various components of the imaging sensor device.

Because such clock signals may often be provided to imaging sensor devices by external sources (e.g., from a clock generator on a host device), the clock signals can be intentionally or unintentionally altered to have a clock rate outside an expected normal range. As a result of such abnormal clock signals, the imaging sensor devices may be damaged, may fail to comply with regulatory requirements, or otherwise may fail to function as intended or desired. However, conventional imaging sensor devices cannot detect and/or prevent such abnormal clock rates in an efficient and effective manner.

SUMMARY

Various techniques are provided to detect abnormal clock rates in devices such as imaging sensor devices (e.g., infrared and/or visible light imaging devices). In one example, a device may include a clock rate detection circuit that may be readily integrated as part of the device to provide effective detection of an abnormal clock rate. The device may include a ramp generator, a counter, and/or other components which may already be implemented as part of the device. The ramp generator may generate a ramp signal independent of a clock signal provided to the device, while the counter may increment or decrement a count value in response to the clock signal. The device may include a comparator adapted to select a current count value of the counter when the ramp signal reaches a reference signal. A processor of the device may be adapted to determine whether the clock signal is operating in an acceptable frequency range, based on the selected count value.

In one embodiment, a device includes a counter configured to receive a clock signal and adjust a count value in response to the clock signal; a ramp generator configured to generate a ramp signal having a slope independent of the clock signal; a comparator configured to receive a reference signal via a first input and the ramp signal via a second input, and select a current count value of the counter in response to the reference signal and the ramp signal; and a processor configured to determine, based on the current count value, if a frequency of the clock signal is within a specified range.

The device may, according to some embodiments, be configured to provide a substantially temperature-stable current count value based on which the processor may detect an abnormal frequency of the clock signal. In such embodiments, the reference signal and the ramp signal may exhibit similar variations over temperature, such that the current count value selected by the comparator is substantially stable over temperature. This may be accomplished by, for example, providing a matched pair of first and second analog components that are configured to pass or generate analog signals that exhibit similar variations over temperature, where the first analog component may be provided in a signal path between the reference signal generator and the first input of the comparator, and where the second analog component may be provided in a signal path between a ramp generator for generating the ramp signal and the second input of the comparator. The matched pair may comprise a patch pair of first and second buffers, such as level shift buffers.

In another embodiment, a method includes adjusting a count value in response to a clock signal; generating a ramp signal having a slope independent of the clock signal; selecting a current value of the count value in response to the reference signal and the ramp signal; and determining, based on the current count value, if a frequency of the clock signal is within a specified range.

The selecting of the current count value, and in turn the determination of an abnormal frequency of the clock signal, according to some embodiments, may not be substantially affected by temperature variations. In such embodiments, the reference signal and the ramp signal may exhibit similar variations over temperature. This may be accomplished by, for example, passing or adjusting the reference signal by a first analog component prior to the selecting, and passing or adjusting the ramp signal by a second analog component prior to the selecting, where the first and the second analog components are provided as a matched pair configured to exhibit similar temperature-dependent variations in the passed or adjusted signals. The matched pair may comprise a patch pair of first and second buffers, such as level shift buffers.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
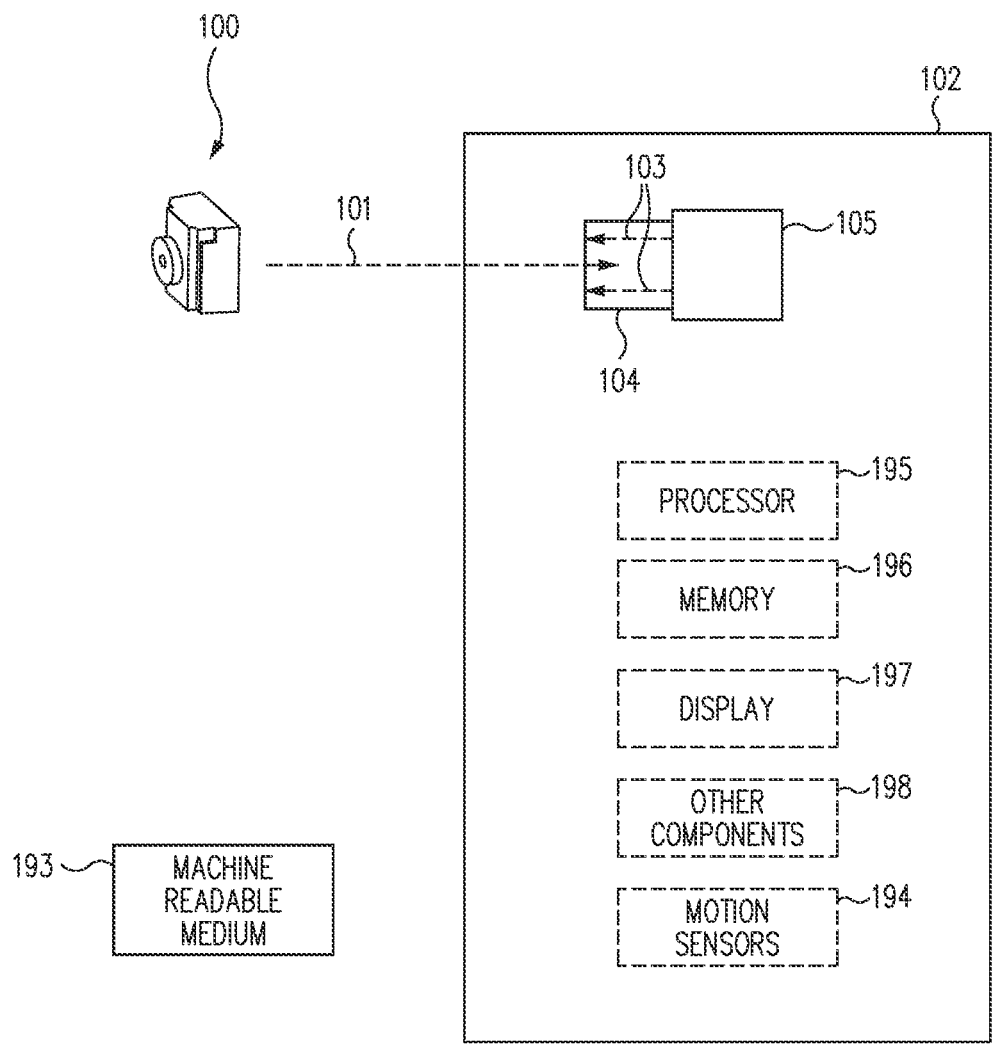
FIG. 1 illustrates an infrared imaging module configured to be implemented in a host device in accordance with an embodiment of the disclosure.

FIG. 1 illustrates an infrared imaging module 100 (e.g., an infrared camera or an infrared imaging device) configured to be implemented in a host device 102 in accordance with an embodiment of the disclosure. Infrared imaging module 100 may be implemented, for one or more embodiments, with a small form factor and in accordance with wafer level packaging techniques or other packaging techniques.

In one embodiment, infrared imaging module 100 may be configured to be implemented in a small portable host device 102, such as a mobile telephone, a tablet computing device, a laptop computing device, a personal digital assistant, a visible light camera, a music player, or any other appropriate mobile device. In this regard, infrared imaging module 100 may be used to provide infrared imaging features to host device 102. For example, infrared imaging module 100 may be configured to capture, process, and/or otherwise manage infrared images and provide such infrared images to host device 102 for use in any desired fashion (e.g., for further processing, to store in memory, to display, to use by various applications running on host device 102, to export to other devices, or other uses).

In various embodiments, infrared imaging module 100 may be configured to operate at low voltage levels and over a wide temperature range. For example, in one embodiment, infrared imaging module 100 may operate using a power supply of approximately 2.4 volts, 2.5 volts, 2.8 volts, or lower voltages, and operate over a temperature range of approximately −20 degrees C. to approximately +60 degrees C. (e.g., providing a suitable dynamic range and performance over an environmental temperature range of approximately 80 degrees C.). In one embodiment, by operating infrared imaging module 100 at low voltage levels, infrared imaging module 100 may experience reduced amounts of self heating in comparison with other types of infrared imaging devices. As a result, infrared imaging module 100 may be operated with reduced measures to compensate for such self heating.

Figure 2:
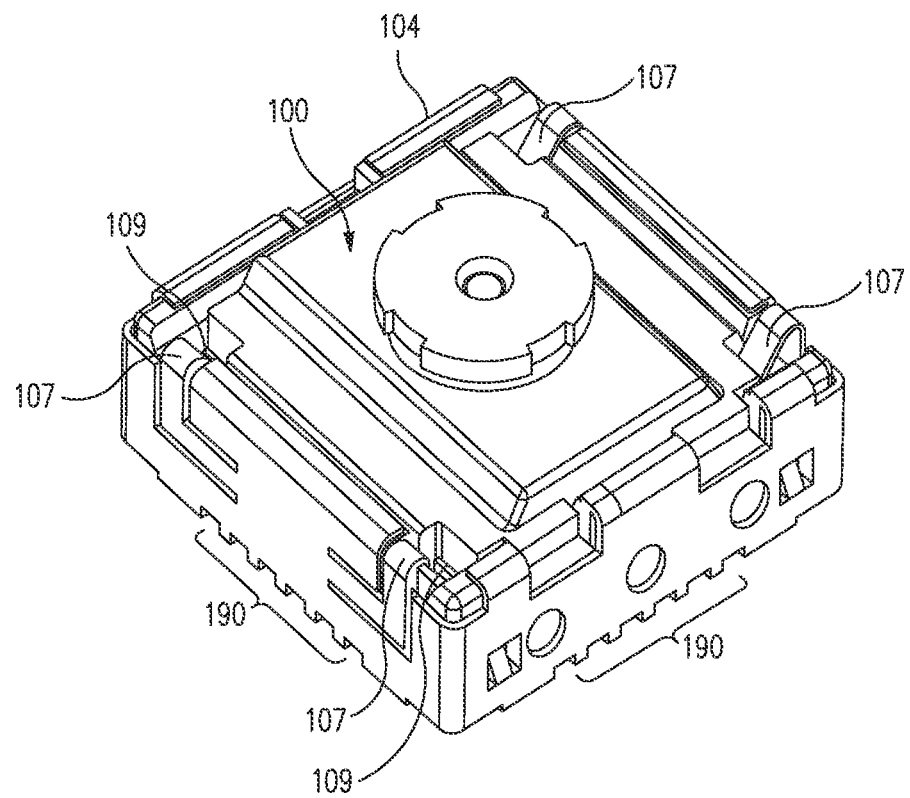
FIG. 2 illustrates an assembled infrared imaging module in accordance with an embodiment of the disclosure.

As shown in FIG. 1, host device 102 may include a socket 104, a shutter 105, motion sensors 194, a processor 195, a memory 196, a display 197, and/or other components 198. Socket 104 may be configured to receive infrared imaging module 100 as identified by arrow 101. In this regard, FIG. 2 illustrates infrared imaging module 100 assembled in socket 104 in accordance with an embodiment of the disclosure.

Motion sensors 194 may be implemented by one or more accelerometers, gyroscopes, or other appropriate devices that may be used to detect movement of host device 102. Motion sensors 194 may be monitored by and provide information to processing module 160 or processor 195 to detect motion. In various embodiments, motion sensors 194 may be implemented as part of host device 102 (as shown in FIG. 1), infrared imaging module 100, or other devices attached to or otherwise interfaced with host device 102.

Processor 195 may be implemented as any appropriate processing device (e.g., logic device, microcontroller, processor, application specific integrated circuit (ASIC), or other device) that may be used by host device 102 to execute appropriate instructions, such as software instructions provided in memory 196. Display 197 may be used to display captured and/or processed infrared images and/or other images, data, and information. Other components 198 may be used to implement any features of host device 102 as may be desired for various applications (e.g., clocks, temperature sensors, a visible light camera, or other components). In addition, a machine readable medium 193 may be provided for storing non-transitory instructions for loading into memory 196 and execution by processor 195.

In various embodiments, infrared imaging module 100 and socket 104 may be implemented for mass production to facilitate high volume applications, such as for implementation in mobile telephones or other devices (e.g., requiring small form factors). In one embodiment, the combination of infrared imaging module 100 and socket 104 may exhibit overall dimensions of approximately 8.5 mm by 8.5 mm by 5.9 mm while infrared imaging module 100 is installed in socket 104.

Figure 3:
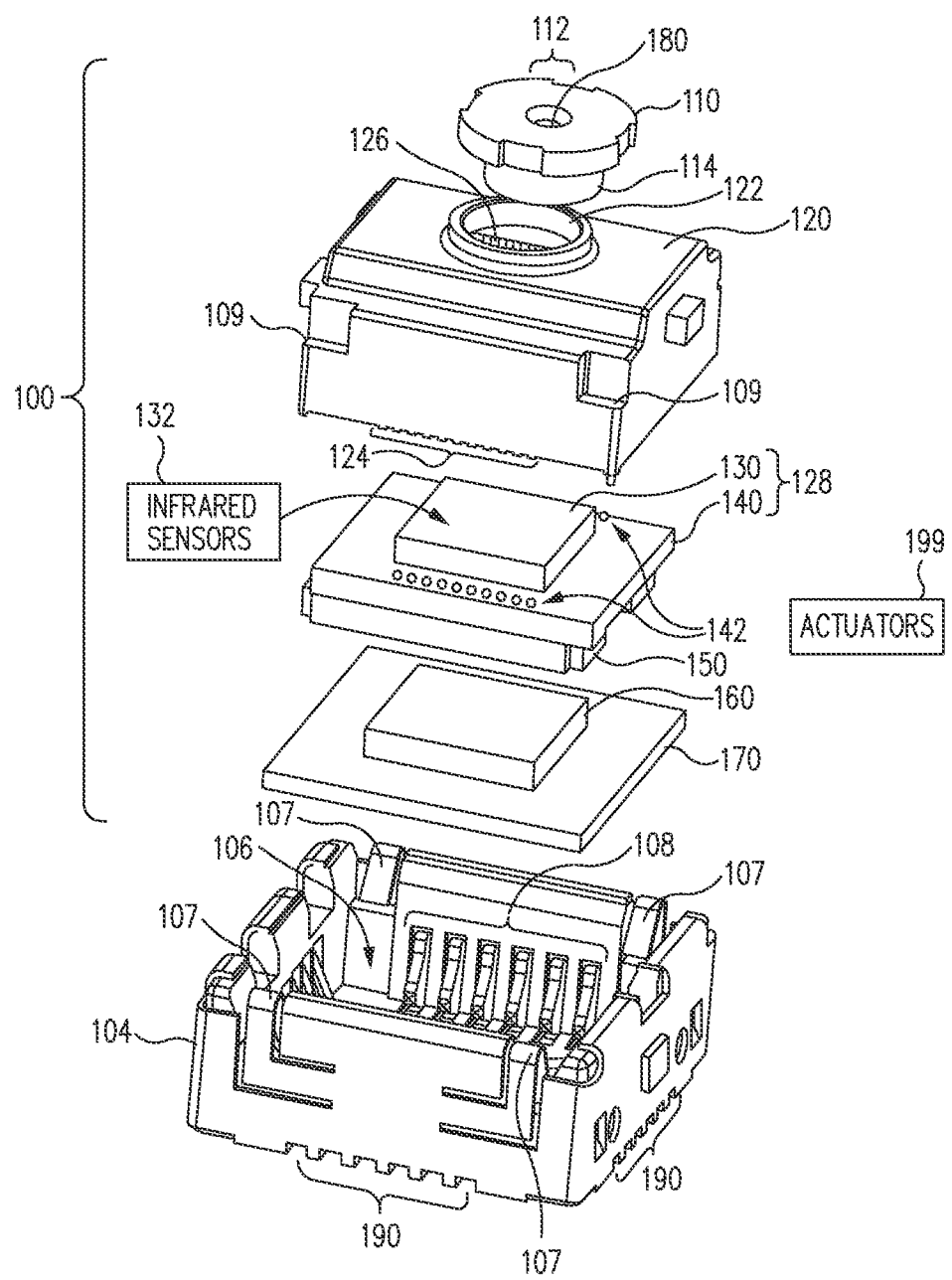
FIG. 3 illustrates an exploded view of an infrared imaging module juxtaposed over a socket in accordance with an embodiment of the disclosure.

FIG. 3 illustrates an exploded view of infrared imaging module 100 juxtaposed over socket 104 in accordance with an embodiment of the disclosure. Infrared imaging module 100 may include a lens barrel 110, a housing 120, an infrared sensor assembly 128, a circuit board 170, a base 150, and a processing module 160.

Lens barrel 110 may at least partially enclose an optical element 180 (e.g., a lens) which is partially visible in FIG. 3 through an aperture 112 in lens barrel 110. Lens barrel 110 may include a substantially cylindrical extension 114 which may be used to interface lens barrel 110 with an aperture 122 in housing 120.

Infrared sensor assembly 128 may be implemented, for example, with a cap 130 (e.g., a lid) mounted on a substrate 140. Infrared sensor assembly 128 may include a plurality of infrared sensors 132 (e.g., infrared detectors) implemented in an array or other fashion on substrate 140 and covered by cap 130. For example, in one embodiment, infrared sensor assembly 128 may be implemented as a focal plane array (FPA). Such a focal plane array may be implemented, for example, as a vacuum package assembly (e.g., sealed by cap 130 and substrate 140). In one embodiment, infrared sensor assembly 128 may be implemented as a wafer level package (e.g., infrared sensor assembly 128 may be singulated from a set of vacuum package assemblies provided on a wafer). In one embodiment, infrared sensor assembly 128 may be implemented to operate using a power supply of approximately 2.4 volts, 2.5 volts, 2.8 volts, or similar voltages.

Infrared sensors 132 may be configured to detect infrared radiation (e.g., infrared energy) from a target scene including, for example, mid wave infrared wave bands (MWIR), long wave infrared wave bands (LWIR), and/or other thermal imaging bands as may be desired in particular implementations. In one embodiment, infrared sensor assembly 128 may be provided in accordance with wafer level packaging techniques.

Infrared sensors 132 may be implemented, for example, as microbolometers or other types of thermal imaging infrared sensors arranged in any desired array pattern to provide a plurality of pixels. In one embodiment, infrared sensors 132 may be implemented as vanadium oxide (VOx) detectors with a 17 μm pixel pitch. In various embodiments, arrays of approximately 32 by 32 infrared sensors 132, approximately 64 by 64 infrared sensors 132, approximately 80 by 64 infrared sensors 132, or other array sizes may be used.

Substrate 140 may include various circuitry including, for example, a read out integrated circuit (ROIC) with dimensions less than approximately 5.5 mm by 5.5 mm in one embodiment. Substrate 140 may also include bond pads 142 that may be used to contact complementary connections positioned on inside surfaces of housing 120 when infrared imaging module 100 is assembled as shown in FIG. 3. In one embodiment, the ROIC may be implemented with low-dropout regulators (LDO) to perform voltage regulation to reduce power supply noise introduced to infrared sensor assembly 128 and thus provide an improved power supply rejection ratio (PSRR). Moreover, by implementing the LDO with the ROIC (e.g., within a wafer level package), less die area may be consumed and fewer discrete die (or chips) are needed.

Figure 4:
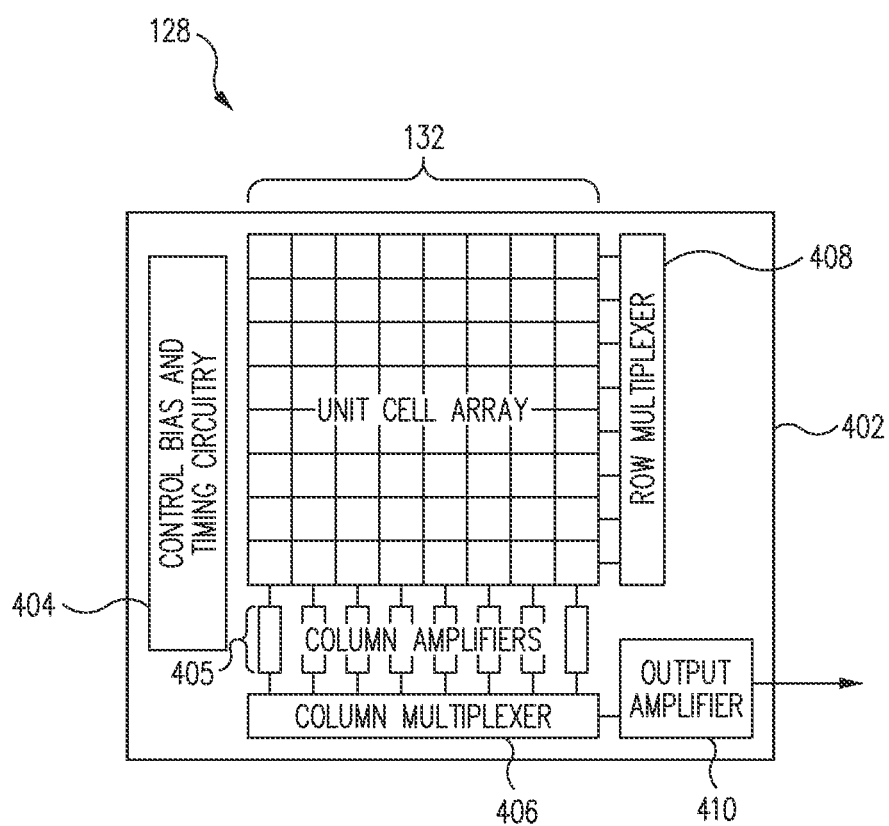
FIG. 4 illustrates a block diagram of an infrared sensor assembly including an array of infrared sensors in accordance with an embodiment of the disclosure.

FIG. 4 illustrates a block diagram of infrared sensor assembly 128 including an array of infrared sensors 132 in accordance with an embodiment of the disclosure. In the illustrated embodiment, infrared sensors 132 are provided as part of a unit cell array of a ROIC 402. ROIC 402 includes bias generation and timing control circuitry 404, column amplifiers 405, a column multiplexer 406, a row multiplexer 408, and an output amplifier 410. Image frames (e.g., thermal images) captured by infrared sensors 132 may be provided by output amplifier 410 to processing module 160, processor 195, and/or any other appropriate components to perform various processing techniques described herein. Although an 8 by 8 array is shown in FIG. 4, any desired array configuration may be used in other embodiments. Further descriptions of ROICs and infrared sensors (e.g., microbolometer circuits) may be found in U.S. Pat. No. 6,028,309 issued Feb. 22, 2000, which is incorporated herein by reference in its entirety.

Infrared sensor assembly 128 may capture images (e.g., image frames) and provide such images from its ROIC at various rates. Processing module 160 may be used to perform appropriate processing of captured infrared images and may be implemented in accordance with any appropriate architecture. In one embodiment, processing module 160 may be implemented as an ASIC. In this regard, such an ASIC may be configured to perform image processing with high performance and/or high efficiency. In another embodiment, processing module 160 may be implemented with a general purpose central processing unit (CPU) which may be configured to execute appropriate software instructions to perform image processing, coordinate and perform image processing with various image processing blocks, coordinate interfacing between processing module 160 and host device 102, and/or other operations. In yet another embodiment, processing module 160 may be implemented with a field programmable gate array (FPGA). Processing module 160 may be implemented with other types of processing and/or logic circuits in other embodiments as would be understood by one skilled in the art.

In these and other embodiments, processing module 160 may also be implemented with other components where appropriate, such as, volatile memory, non-volatile memory, and/or one or more interfaces (e.g., infrared detector interfaces, inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces).

In some embodiments, infrared imaging module 100 may further include one or more actuators 199 which may be used to adjust the focus of infrared image frames captured by infrared sensor assembly 128. For example, actuators 199 may be used to move optical element 180, infrared sensors 132, and/or other components relative to each other to selectively focus and defocus infrared image frames in accordance with techniques described herein. Actuators 199 may be implemented in accordance with any type of motion-inducing apparatus or mechanism, and may be positioned at any location within or external to infrared imaging module 100 as appropriate for different applications.

When infrared imaging module 100 is assembled, housing 120 may substantially enclose infrared sensor assembly 128, base 150, and processing module 160. Housing 120 may facilitate connection of various components of infrared imaging module 100. For example, in one embodiment, housing 120 may provide electrical connections 126 to connect various components as further described.

Electrical connections 126 (e.g., conductive electrical paths, traces, or other types of connections) may be electrically connected with bond pads 142 when infrared imaging module 100 is assembled. In various embodiments, electrical connections 126 may be embedded in housing 120, provided on inside surfaces of housing 120, and/or otherwise provided by housing 120. Electrical connections 126 may terminate in connections 124 protruding from the bottom surface of housing 120 as shown in FIG. 3. Connections 124 may connect with circuit board 170 when infrared imaging module 100 is assembled (e.g., housing 120 may rest atop circuit board 170 in various embodiments). Processing module 160 may be electrically connected with circuit board 170 through appropriate electrical connections. As a result, infrared sensor assembly 128 may be electrically connected with processing module 160 through, for example, conductive electrical paths provided by: bond pads 142, complementary connections on inside surfaces of housing 120, electrical connections 126 of housing 120, connections 124, and circuit board 170. Advantageously, such an arrangement may be implemented without requiring wire bonds to be provided between infrared sensor assembly 128 and processing module 160.

In various embodiments, electrical connections 126 in housing 120 may be made from any desired material (e.g., copper or any other appropriate conductive material). In one embodiment, electrical connections 126 may aid in dissipating heat from infrared imaging module 100.

Other connections may be used in other embodiments. For example, in one embodiment, sensor assembly 128 may be attached to processing module 160 through a ceramic board that connects to sensor assembly 128 by wire bonds and to processing module 160 by a ball grid array (BGA). In another embodiment, sensor assembly 128 may be mounted directly on a rigid flexible board and electrically connected with wire bonds, and processing module 160 may be mounted and connected to the rigid flexible board with wire bonds or a BGA.

The various implementations of infrared imaging module 100 and host device 102 set forth herein are provided for purposes of example, rather than limitation. In this regard, any of the various techniques described herein may be applied to any infrared camera system, infrared imager, or other device for performing infrared/thermal imaging.

Substrate 140 of infrared sensor assembly 128 may be mounted on base 150. In various embodiments, base 150 (e.g., a pedestal) may be made, for example, of copper formed by metal injection molding (MIM) and provided with a black oxide or nickel-coated finish. In various embodiments, base 150 may be made of any desired material, such as for example zinc, aluminum, or magnesium, as desired for a given application and may be formed by any desired applicable process, such as for example aluminum casting, MIM, or zinc rapid casting, as may be desired for particular applications. In various embodiments, base 150 may be implemented to provide structural support, various circuit paths, thermal heat sink properties, and other features where appropriate. In one embodiment, base 150 may be a multi-layer structure implemented at least in part using ceramic material.

In various embodiments, circuit board 170 may receive housing 120 and thus may physically support the various components of infrared imaging module 100. In various embodiments, circuit board 170 may be implemented as a printed circuit board (e.g., an FR4 circuit board or other types of circuit boards), a rigid or flexible interconnect (e.g., tape or other type of interconnects), a flexible circuit substrate, a flexible plastic substrate, or other appropriate structures. In various embodiments, base 150 may be implemented with the various features and attributes described for circuit board 170, and vice versa.

Socket 104 may include a cavity 106 configured to receive infrared imaging module 100 (e.g., as shown in the assembled view of FIG. 2). Infrared imaging module 100 and/or socket 104 may include appropriate tabs, arms, pins, fasteners, or any other appropriate engagement members which may be used to secure infrared imaging module 100 to or within socket 104 using friction, tension, adhesion, and/or any other appropriate manner. Socket 104 may include engagement members 107 that may engage surfaces 109 of housing 120 when infrared imaging module 100 is inserted into a cavity 106 of socket 104. Other types of engagement members may be used in other embodiments.

Infrared imaging module 100 may be electrically connected with socket 104 through appropriate electrical connections (e.g., contacts, pins, wires, or any other appropriate connections). For example, socket 104 may include electrical connections 108 which may contact corresponding electrical connections of infrared imaging module 100 (e.g., interconnect pads, contacts, or other electrical connections on side or bottom surfaces of circuit board 170, bond pads 142 or other electrical connections on base 150, or other connections). Electrical connections 108 may be made from any desired material (e.g., copper or any other appropriate conductive material). In one embodiment, electrical connections 108 may be mechanically biased to press against electrical connections of infrared imaging module 100 when infrared imaging module 100 is inserted into cavity 106 of socket 104. In one embodiment, electrical connections 108 may at least partially secure infrared imaging module 100 in socket 104. Other types of electrical connections may be used in other embodiments.

Socket 104 may be electrically connected with host device 102 through similar types of electrical connections. For example, in one embodiment, host device 102 may include electrical connections (e.g., soldered connections, snap-in connections, or other connections) that connect with electrical connections 108 passing through apertures 190. In various embodiments, such electrical connections may be made to the sides and/or bottom of socket 104.

Various components of infrared imaging module 100 may be implemented with flip chip technology which may be used to mount components directly to circuit boards without the additional clearances typically needed for wire bond connections. Flip chip connections may be used, as an example, to reduce the overall size of infrared imaging module 100 for use in compact small form factor applications. For example, in one embodiment, processing module 160 may be mounted to circuit board 170 using flip chip connections. For example, infrared imaging module 100 may be implemented with such flip chip configurations.

In various embodiments, infrared imaging module 100 and/or associated components may be implemented in accordance with various techniques (e.g., wafer level packaging techniques) as set forth in U.S. patent application Ser. No. 12/844,124 filed Jul. 27, 2010, and U.S. Provisional Patent Application No. 61/469,651 filed Mar. 30, 2011, which are incorporated herein by reference in their entirety. Furthermore, in accordance with one or more embodiments, infrared imaging module 100 and/or associated components may be implemented, calibrated, tested, and/or used in accordance with various techniques, such as for example as set forth in U.S. Pat. No. 7,470,902 issued Dec. 30, 2008, U.S. Pat. No. 6,028,309 issued Feb. 22, 2000, U.S. Pat. No. 6,812,465 issued Nov. 2, 2004, U.S. Pat. No. 7,034,301 issued Apr. 25, 2006, U.S. Pat. No. 7,679,048 issued Mar. 16, 2010, U.S. Pat. No. 7,470,904 issued Dec. 30, 2008, U.S. patent application Ser. No. 12/202,880 filed Sep. 2, 2008, and U.S. patent application Ser. No. 12/202,896 filed Sep. 2, 2008, which are incorporated herein by reference in their entirety.

Referring again to FIG. 1, in various embodiments, host device 102 may include shutter 105. In this regard, shutter 105 may be selectively positioned over socket 104 (e.g., as identified by arrows 103) while infrared imaging module 100 is installed therein. In this regard, shutter 105 may be used, for example, to protect infrared imaging module 100 when not in use. Shutter 105 may also be used as a temperature reference as part of a calibration process (e.g., a NUC process or other calibration processes) for infrared imaging module 100 as would be understood by one skilled in the art.

In various embodiments, shutter 105 may be made from various materials such as, for example, polymers, glass, aluminum (e.g., painted or anodized) or other materials. In various embodiments, shutter 105 may include one or more coatings to selectively filter electromagnetic radiation and/or adjust various optical properties of shutter 105 (e.g., a uniform blackbody coating or a reflective gold coating).

In another embodiment, shutter 105 may be fixed in place to protect infrared imaging module 100 at all times. In this case, shutter 105 or a portion of shutter 105 may be made from appropriate materials (e.g., polymers or infrared transmitting materials such as silicon, germanium, zinc selenide, or chalcogenide glasses) that do not substantially filter desired infrared wavelengths. In another embodiment, a shutter may be implemented as part of infrared imaging module 100 (e.g., within or as part of a lens barrel or other components of infrared imaging module 100), as would be understood by one skilled in the art.

Alternatively, in another embodiment, a shutter (e.g., shutter 105 or other type of external or internal shutter) need not be provided, but rather a NUC process or other type of calibration may be performed using shutterless techniques. In another embodiment, a NUC process or other type of calibration using shutterless techniques may be performed in combination with shutter-based techniques.

Infrared imaging module 100 and host device 102 may be implemented in accordance with any of the various techniques set forth in U.S. Provisional Patent Application No. 61/495,873 filed Jun. 10, 2011, U.S. Provisional Patent Application No. 61/495,879 filed Jun. 10, 2011, and U.S. Provisional Patent Application No. 61/495,888 filed Jun. 10, 2011, which are incorporated herein by reference in their entirety.

In various embodiments, the components of host device 102 and/or infrared imaging module 100 may be implemented as a local or distributed system with components in communication with each other over wired and/or wireless networks. Accordingly, the various operations identified in this disclosure may be performed by local and/or remote components as may be desired in particular implementations.

Figure 5:
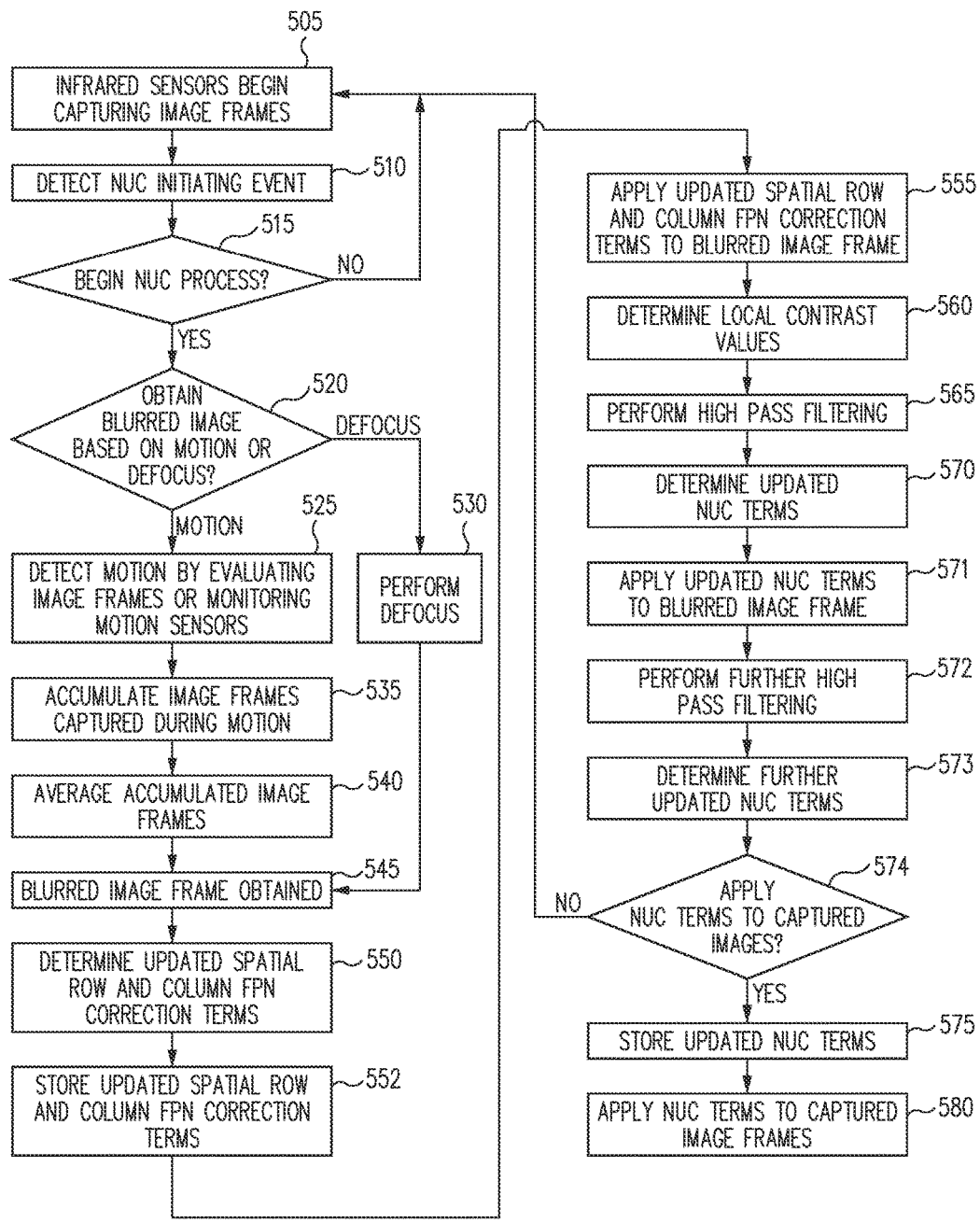
FIG. 5 illustrates a flow diagram of various operations to determine non-uniformity correction (NUC) terms in accordance with an embodiment of the disclosure.

FIG. 5 illustrates a flow diagram of various operations to determine NUC terms in accordance with an embodiment of the disclosure. In some embodiments, the operations of FIG. 5 may be performed by processing module 160 or processor 195 (both also generally referred to as a processor) operating on image frames captured by infrared sensors 132.

In block 505, infrared sensors 132 begin capturing image frames of a scene. Typically, the scene will be the real world environment in which host device 102 is currently located. In this regard, shutter 105 (if optionally provided) may be opened to permit infrared imaging module to receive infrared radiation from the scene. Infrared sensors 132 may continue capturing image frames during all operations shown in FIG. 5. In this regard, the continuously captured image frames may be used for various operations as further discussed. In one embodiment, the captured image frames may be temporally filtered (e.g., in accordance with the process of block 826 further described herein with regard to FIG. 8) and be processed by other terms (e.g., factory gain terms 812, factory offset terms 816, previously determined NUC terms 817, column FPN terms 820, and row FPN terms 824 as further described herein with regard to FIG. 8) before they are used in the operations shown in FIG. 5.

In block 510, a NUC process initiating event is detected. In one embodiment, the NUC process may be initiated in response to physical movement of host device 102. Such movement may be detected, for example, by motion sensors 194 which may be polled by a processor. In one example, a user may move host device 102 in a particular manner, such as by intentionally waving host device 102 back and forth in an "erase" or "swipe" movement. In this regard, the user may move host device 102 in accordance with a predetermined speed and direction (velocity), such as in an up and down, side to side, or other pattern to initiate the NUC process. In this example, the use of such movements may permit the user to intuitively operate host device 102 to simulate the "erasing" of noise in captured image frames.

In another example, a NUC process may be initiated by host device 102 if motion exceeding a threshold value is detected (e.g., motion greater than expected for ordinary use). It is contemplated that any desired type of spatial translation of host device 102 may be used to initiate the NUC process.

In yet another example, a NUC process may be initiated by host device 102 if a minimum time has elapsed since a previously performed NUC process. In a further example, a NUC process may be initiated by host device 102 if infrared imaging module 100 has experienced a minimum temperature change since a previously performed NUC process. In a still further example, a NUC process may be continuously initiated and repeated.

In block 515, after a NUC process initiating event is detected, it is determined whether the NUC process should actually be performed. In this regard, the NUC process may be selectively initiated based on whether one or more additional conditions are met. For example, in one embodiment, the NUC process may not be performed unless a minimum time has elapsed since a previously performed NUC process. In another embodiment, the NUC process may not be performed unless infrared imaging module 100 has experienced a minimum temperature change since a previously performed NUC process. Other criteria or conditions may be used in other embodiments. If appropriate criteria or conditions have been met, then the flow diagram continues to block 520. Otherwise, the flow diagram returns to block 505.

In the NUC process, blurred image frames may be used to determine NUC terms which may be applied to captured image frames to correct for FPN. As discussed, in one embodiment, the blurred image frames may be obtained by accumulating multiple image frames of a moving scene (e.g., captured while the scene and/or the thermal imager is in motion). In another embodiment, the blurred image frames may be obtained by defocusing an optical element or other component of the thermal imager.

Accordingly, in block 520 a choice of either approach is provided. If the motion-based approach is used, then the flow diagram continues to block 525. If the defocus-based approach is used, then the flow diagram continues to block 530.

Referring now to the motion-based approach, in block 525 motion is detected. For example, in one embodiment, motion may be detected based on the image frames captured by infrared sensors 132. In this regard, an appropriate motion detection process (e.g., an image registration process, a frame-to-frame difference calculation, or other appropriate process) may be applied to captured image frames to determine whether motion is present (e.g., whether static or moving image frames have been captured). For example, in one embodiment, it can be determined whether pixels or regions around the pixels of consecutive image frames have changed more than a user defined amount (e.g., a percentage and/or threshold value). If at least a given percentage of pixels have changed by at least the user defined amount, then motion will be detected with sufficient certainty to proceed to block 535.

In another embodiment, motion may be determined on a per pixel basis, wherein only pixels that exhibit significant changes are accumulated to provide the blurred image frame. For example, counters may be provided for each pixel and used to ensure that the same number of pixel values are accumulated for each pixel, or used to average the pixel values based on the number of pixel values actually accumulated for each pixel. Other types of image-based motion detection may be performed such as performing a Radon transform.

In another embodiment, motion may be detected based on data provided by motion sensors 194. In one embodiment, such motion detection may include detecting whether host device 102 is moving along a relatively straight trajectory through space. For example, if host device 102 is moving along a relatively straight trajectory, then it is possible that certain objects appearing in the imaged scene may not be sufficiently blurred (e.g., objects in the scene that may be aligned with or moving substantially parallel to the straight trajectory). Thus, in such an embodiment, the motion detected by motion sensors 194 may be conditioned on host device 102 exhibiting, or not exhibiting, particular trajectories.

In yet another embodiment, both a motion detection process and motion sensors 194 may be used. Thus, using any of these various embodiments, a determination can be made as to whether or not each image frame was captured while at least a portion of the scene and host device 102 were in motion relative to each other (e.g., which may be caused by host device 102 moving relative to the scene, at least a portion of the scene moving relative to host device 102, or both).

It is expected that the image frames for which motion was detected may exhibit some secondary blurring of the captured scene (e.g., blurred thermal image data associated with the scene) due to the thermal time constants of infrared sensors 132 (e.g., microbolometer thermal time constants) interacting with the scene movement.

In block 535, image frames for which motion was detected are accumulated. For example, if motion is detected for a continuous series of image frames, then the image frames of the series may be accumulated. As another example, if motion is detected for only some image frames, then the non-moving image frames may be skipped and not included in the accumulation. Thus, a continuous or discontinuous set of image frames may be selected to be accumulated based on the detected motion.

In block 540, the accumulated image frames are averaged to provide a blurred image frame. Because the accumulated image frames were captured during motion, it is expected that actual scene information will vary between the image frames and thus cause the scene information to be further blurred in the resulting blurred image frame (block 545).

In contrast, FPN (e.g., caused by one or more components of infrared imaging module 100) will remain fixed over at least short periods of time and over at least limited changes in scene irradiance during motion. As a result, image frames captured in close proximity in time and space during motion will suffer from identical or at least very similar FPN. Thus, although scene information may change in consecutive image frames, the FPN will stay essentially constant. By averaging, multiple image frames captured during motion will blur the scene information, but will not blur the FPN. As a result, FPN will remain more clearly defined in the blurred image frame provided in block 545 than the scene information.

In one embodiment, 32 or more image frames are accumulated and averaged in blocks 535 and 540. However, any desired number of image frames may be used in other embodiments, but with generally decreasing correction accuracy as frame count is decreased.

Referring now to the defocus-based approach, in block 530, a defocus operation may be performed to intentionally defocus the image frames captured by infrared sensors 132. For example, in one embodiment, one or more actuators 199 may be used to adjust, move, or otherwise translate optical element 180, infrared sensor assembly 128, and/or other components of infrared imaging module 100 to cause infrared sensors 132 to capture a blurred (e.g., unfocused) image frame of the scene. Other non-actuator based techniques are also contemplated for intentionally defocusing infrared image frames such as, for example, manual (e.g., user-initiated) defocusing.

Although the scene may appear blurred in the image frame, FPN (e.g., caused by one or more components of infrared imaging module 100) will remain unaffected by the defocusing operation. As a result, a blurred image frame of the scene will be provided (block 545) with FPN remaining more clearly defined in the blurred image than the scene information.

In the above discussion, the defocus-based approach has been described with regard to a single captured image frame. In another embodiment, the defocus-based approach may include accumulating multiple image frames while the infrared imaging module 100 has been defocused and averaging the defocused image frames to remove the effects of temporal noise and provide a blurred image frame in block 545.

Thus, it will be appreciated that a blurred image frame may be provided in block 545 by either the motion-based approach or the defocus-based approach. Because much of the scene information will be blurred by either motion, defocusing, or both, the blurred image frame may be effectively considered a low pass filtered version of the original captured image frames with respect to scene information.

In block 550, the blurred image frame is processed to determine updated row and column FPN terms (e.g., if row and column FPN terms have not been previously determined then the updated row and column FPN terms may be new row and column FPN terms in the first iteration of block 550). As used in this disclosure, the terms row and column may be used interchangeably depending on the orientation of infrared sensors 132 and/or other components of infrared imaging module 100.

In one embodiment, block 550 includes determining a spatial FPN correction term for each row of the blurred image frame (e.g., each row may have its own spatial FPN correction term), and also determining a spatial FPN correction term for each column of the blurred image frame (e.g., each column may have its own spatial FPN correction term). Such processing may be used to reduce the spatial and slowly varying (1/f) row and column FPN inherent in thermal imagers caused by, for example, 1/f noise characteristics of amplifiers in ROIC 402 which may manifest as vertical and horizontal stripes in image frames.

Advantageously, by determining spatial row and column FPN terms using the blurred image frame, there will be a reduced risk of vertical and horizontal objects in the actual imaged scene from being mistaken for row and column noise (e.g., real scene content will be blurred while FPN remains unblurred).

Figure 6:
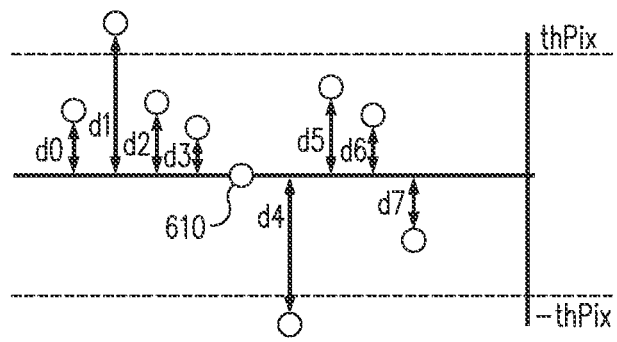
FIG. 6 illustrates differences between neighboring pixels in accordance with an embodiment of the disclosure.

In one embodiment, row and column FPN terms may be determined by considering differences between neighboring pixels of the blurred image frame. For example, FIG. 6 illustrates differences between neighboring pixels in accordance with an embodiment of the disclosure. Specifically, in FIG. 6 a pixel 610 is compared to its 8 nearest horizontal neighbors: d0-d3 on one side and d4-d7 on the other side. Differences between the neighbor pixels can be averaged to obtain an estimate of the offset error of the illustrated group of pixels. An offset error may be calculated for each pixel in a row or column and the average result may be used to correct the entire row or column.

To prevent real scene data from being interpreted as noise, upper and lower threshold values may be used (thPix and −thPix). Pixel values falling outside these threshold values (pixels d1 and d4 in this example) are not used to obtain the offset error. In addition, the maximum amount of row and column FPN correction may be limited by these threshold values.

Further techniques for performing spatial row and column FPN correction processing are set forth in U.S. patent application Ser. No. 12/396,340 filed Mar. 2, 2009 which is incorporated herein by reference in its entirety.

Referring again to FIG. 5, the updated row and column FPN terms determined in block 550 are stored (block 552) and applied (block 555) to the blurred image frame provided in block 545. After these terms are applied, some of the spatial row and column FPN in the blurred image frame may be reduced. However, because such terms are applied generally to rows and columns, additional FPN may remain such as spatially uncorrelated FPN associated with pixel to pixel drift or other causes. Neighborhoods of spatially correlated FPN may also remain which may not be directly associated with individual rows and columns. Accordingly, further processing may be performed as discussed below to determine NUC terms.

In block 560, local contrast values (e.g., edges or absolute values of gradients between adjacent or small groups of pixels) in the blurred image frame are determined. If scene information in the blurred image frame includes contrasting areas that have not been significantly blurred (e.g., high contrast edges in the original scene data), then such features may be identified by a contrast determination process in block 560.

For example, local contrast values in the blurred image frame may be calculated, or any other desired type of edge detection process may be applied to identify certain pixels in the blurred image as being part of an area of local contrast. Pixels that are marked in this manner may be considered as containing excessive high spatial frequency scene information that would be interpreted as FPN (e.g., such regions may correspond to portions of the scene that have not been sufficiently blurred). As such, these pixels may be excluded from being used in the further determination of NUC terms. In one embodiment, such contrast detection processing may rely on a threshold that is higher than the expected contrast value associated with FPN (e.g., pixels exhibiting a contrast value higher than the threshold may be considered to be scene information, and those lower than the threshold may be considered to be exhibiting FPN).

In one embodiment, the contrast determination of block 560 may be performed on the blurred image frame after row and column FPN terms have been applied to the blurred image frame (e.g., as shown in FIG. 5). In another embodiment, block 560 may be performed prior to block 550 to determine contrast before row and column FPN terms are determined (e.g., to prevent scene based contrast from contributing to the determination of such terms).

Following block 560, it is expected that any high spatial frequency content remaining in the blurred image frame may be generally attributed to spatially uncorrelated FPN. In this regard, following block 560, much of the other noise or actual desired scene based information has been removed or excluded from the blurred image frame due to: intentional blurring of the image frame (e.g., by motion or defocusing in blocks 520 through 545), application of row and column FPN terms (block 555), and contrast determination (block 560).

Thus, it can be expected that following block 560, any remaining high spatial frequency content (e.g., exhibited as areas of contrast or differences in the blurred image frame)

may be attributed to spatially uncorrelated FPN. Accordingly, in block 565, the blurred image frame is high pass filtered. In one embodiment, this may include applying a high pass filter to extract the high spatial frequency content from the blurred image frame. In another embodiment, this may include applying a low pass filter to the blurred image frame and taking a difference between the low pass filtered image frame and the unfiltered blurred image frame to obtain the high spatial frequency content. In accordance with various embodiments of the present disclosure, a high pass filter may be implemented by calculating a mean difference between a sensor signal (e.g., a pixel value) and its neighbors.

In block 570, a flat field correction process is performed on the high pass filtered blurred image frame to determine updated NUC terms (e.g., if a NUC process has not previously been performed then the updated NUC terms may be new NUC terms in the first iteration of block 570).

Figure 7:
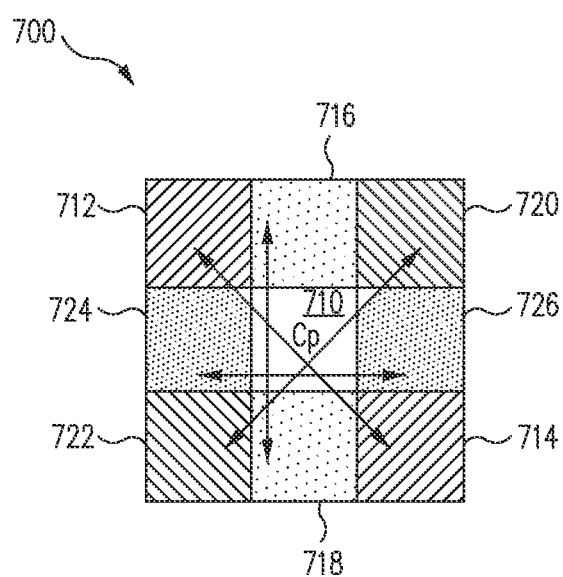
FIG. 7 illustrates a flat field correction technique in accordance with an embodiment of the disclosure.

For example, FIG. 7 illustrates a flat field correction technique 700 in accordance with an embodiment of the disclosure. In FIG. 7, a NUC term may be determined for each pixel 710 of the blurred image frame using the values of its neighboring pixels 712 to 726. For each pixel 710, several gradients may be determined based on the absolute difference between the values of various adjacent pixels. For example, absolute value differences may be determined between: pixels 712 and 714 (a left to right diagonal gradient), pixels 716 and 718 (a top to bottom vertical gradient), pixels 720 and 722 (a right to left diagonal gradient), and pixels 724 and 726 (a left to right horizontal gradient).

These absolute differences may be summed to provide a summed gradient for pixel 710. A weight value may be determined for pixel 710 that is inversely proportional to the summed gradient. This process may be performed for all pixels 710 of the blurred image frame until a weight value is provided for each pixel 710. For areas with low gradients (e.g., areas that are blurry or have low contrast), the weight value will be close to one. Conversely, for areas with high gradients, the weight value will be zero or close to zero. The update to the NUC term as estimated by the high pass filter is multiplied with the weight value.

In one embodiment, the risk of introducing scene information into the NUC terms can be further reduced by applying some amount of temporal damping to the NUC term determination process. For example, a temporal damping factor λ between 0 and 1 may be chosen such that the new NUC term ($NUC_{NEW}$) stored is a weighted average of the old NUC term ($NUC_{OLD}$) and the estimated updated NUC term ($NUC_{UPDATE}$). In one embodiment, this can be expressed as $NUC_{NEW}=\lambda 19\ NUC_{OLD}+(1-\lambda)\cdot(NUC_{OLD}+NUC_{UPDATE})$.

Although the determination of NUC terms has been described with regard to gradients, local contrast values may be used instead where appropriate. Other techniques may also be used such as, for example, standard deviation calculations. Other types flat field correction processes may be performed to determine NUC terms including, for example, various processes identified in U.S. Pat. No. 6,028,309 issued Feb. 22, 2000, U.S. Pat. No. 6,812,465 issued Nov. 2, 2004, and U.S. patent application Ser. No. 12/114,865 filed May 5, 2008, which are incorporated herein by reference in their entirety.

Referring again to FIG. 5, block 570 may include additional processing of the NUC terms. For example, in one embodiment, to preserve the scene signal mean, the sum of all NUC terms may be normalized to zero by subtracting the NUC term mean from each NUC term. Also in block 570, to avoid row and column noise from affecting the NUC terms, the mean value of each row and column may be subtracted from the NUC terms for each row and column. As a result, row and column FPN filters using the row and column FPN terms determined in block 550 may be better able to filter out row and column noise in further iterations (e.g., as further shown in FIG. 8) after the NUC terms are applied to captured images (e.g., in block 580 further discussed herein). In this regard, the row and column FPN filters may in general use more data to calculate the per row and per column offset coefficients (e.g., row and column FPN terms) and may thus provide a more robust alternative for reducing spatially correlated FPN than the NUC terms which are based on high pass filtering to capture spatially uncorrelated noise.

In blocks 571-573, additional high pass filtering and further determinations of updated NUC terms may be optionally performed to remove spatially correlated FPN with lower spatial frequency than previously removed by row and column FPN terms. In this regard, some variability in infrared sensors 132 or other components of infrared imaging module 100 may result in spatially correlated FPN noise that cannot be easily modeled as row or column noise. Such spatially correlated FPN may include, for example, window defects on a sensor package or a cluster of infrared sensors 132 that respond differently to irradiance than neighboring infrared sensors 132. In one embodiment, such spatially correlated FPN may be mitigated with an offset correction. If the amount of such spatially correlated FPN is significant, then the noise may also be detectable in the blurred image frame. Since this type of noise may affect a neighborhood of pixels, a high pass filter with a small kernel may not detect the FPN in the neighborhood (e.g., all values used in high pass filter may be taken from the neighborhood of affected pixels and thus may be affected by the same offset error). For example, if the high pass filtering of block 565 is performed with a small kernel (e.g., considering only immediately adjacent pixels that fall within a neighborhood of pixels affected by spatially correlated FPN), then broadly distributed spatially correlated FPN may not be detected.

Figure 11:
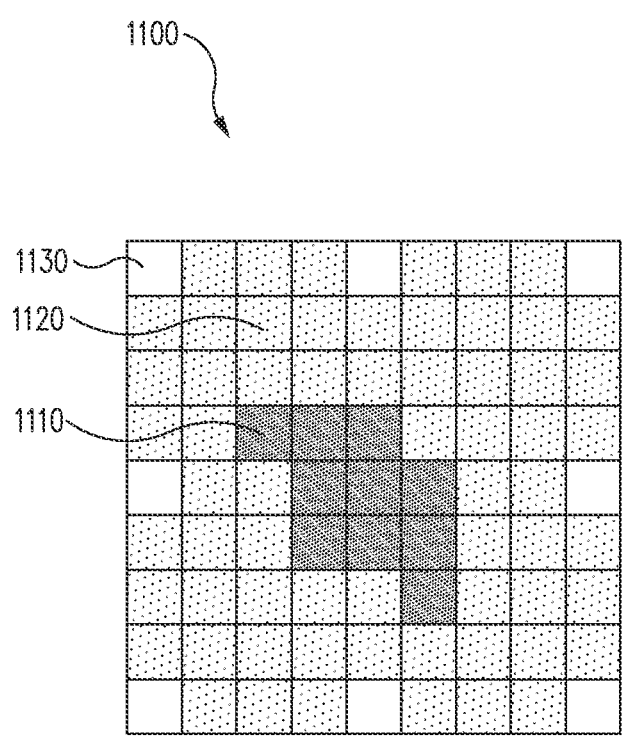
FIG. 11 illustrates spatially correlated fixed pattern noise (FPN) in a neighborhood of pixels in accordance with an embodiment of the disclosure.

For example, FIG. 11 illustrates spatially correlated FPN in a neighborhood of pixels in accordance with an embodiment of the disclosure. As shown in a sample image frame 1100, a neighborhood of pixels 1110 may exhibit spatially correlated FPN that is not precisely correlated to individual rows and columns and is distributed over a neighborhood of several pixels (e.g., a neighborhood of approximately 4 by 4 pixels in this example). Sample image frame 1100 also includes a set of pixels 1120 exhibiting substantially uniform response that are not used in filtering calculations, and a set of pixels 1130 that are used to estimate a low pass value for the neighborhood of pixels 1110. In one embodiment, pixels 1130 may be a number of pixels divisible by two in order to facilitate efficient hardware or software calculations.

Referring again to FIG. 5, in blocks 571-573, additional high pass filtering and further determinations of updated NUC terms may be optionally performed to remove spatially correlated FPN such as exhibited by pixels 1110. In block 571, the updated NUC terms determined in block 570 are applied to the blurred image frame. Thus, at this time, the blurred image frame will have been initially corrected for spatially correlated FPN (e.g., by application of the updated row and column FPN terms in block 555), and also initially corrected for spatially uncorrelated FPN (e.g., by application of the updated NUC terms applied in block 571).

In block 572, a further high pass filter is applied with a larger kernel than was used in block 565, and further updated NUC terms may be determined in block 573. For example, to detect the spatially correlated FPN present in pixels 1110, the high pass filter applied in block 572 may include data from a sufficiently large enough neighborhood of pixels such that differences can be determined between unaffected pixels (e.g., pixels 1120) and affected pixels (e.g., pixels 1110). For example, a low pass filter with a large kernel can be used (e.g., an N by N kernel that is much greater than 3 by 3 pixels) and the results may be subtracted to perform appropriate high pass filtering.

In one embodiment, for computational efficiency, a sparse kernel may be used such that only a small number of neighboring pixels inside an N by N neighborhood are used. For any given high pass filter operation using distant neighbors (e.g., a large kernel), there is a risk of modeling actual (potentially blurred) scene information as spatially correlated FPN. Accordingly, in one embodiment, the temporal damping factor $\lambda$ may be set close to 1 for updated NUC terms determined in block 573.

In various embodiments, blocks 571-573 may be repeated (e.g., cascaded) to iteratively perform high pass filtering with increasing kernel sizes to provide further updated NUC terms further correct for spatially correlated FPN of desired neighborhood sizes. In one embodiment, the decision to perform such iterations may be determined by whether spatially correlated FPN has actually been removed by the updated NUC terms of the previous performance of blocks 571-573.

After blocks 571-573 are finished, a decision is made regarding whether to apply the updated NUC terms to captured image frames (block 574). For example, if an average of the absolute value of the NUC terms for the entire image frame is less than a minimum threshold value, or greater than a maximum threshold value, the NUC terms may be deemed spurious or unlikely to provide meaningful correction. Alternatively, thresholding criteria may be applied to individual pixels to determine which pixels receive updated NUC terms. In one embodiment, the threshold values may correspond to differences between the newly calculated NUC terms and previously calculated NUC terms. In another embodiment, the threshold values may be independent of previously calculated NUC terms. Other tests may be applied (e.g., spatial correlation tests) to determine whether the NUC terms should be applied.

If the NUC terms are deemed spurious or unlikely to provide meaningful correction, then the flow diagram returns to block 505. Otherwise, the newly determined NUC terms are stored (block 575) to replace previous NUC terms (e.g., determined by a previously performed iteration of FIG. 5) and applied (block 580) to captured image frames.

Figure 8:
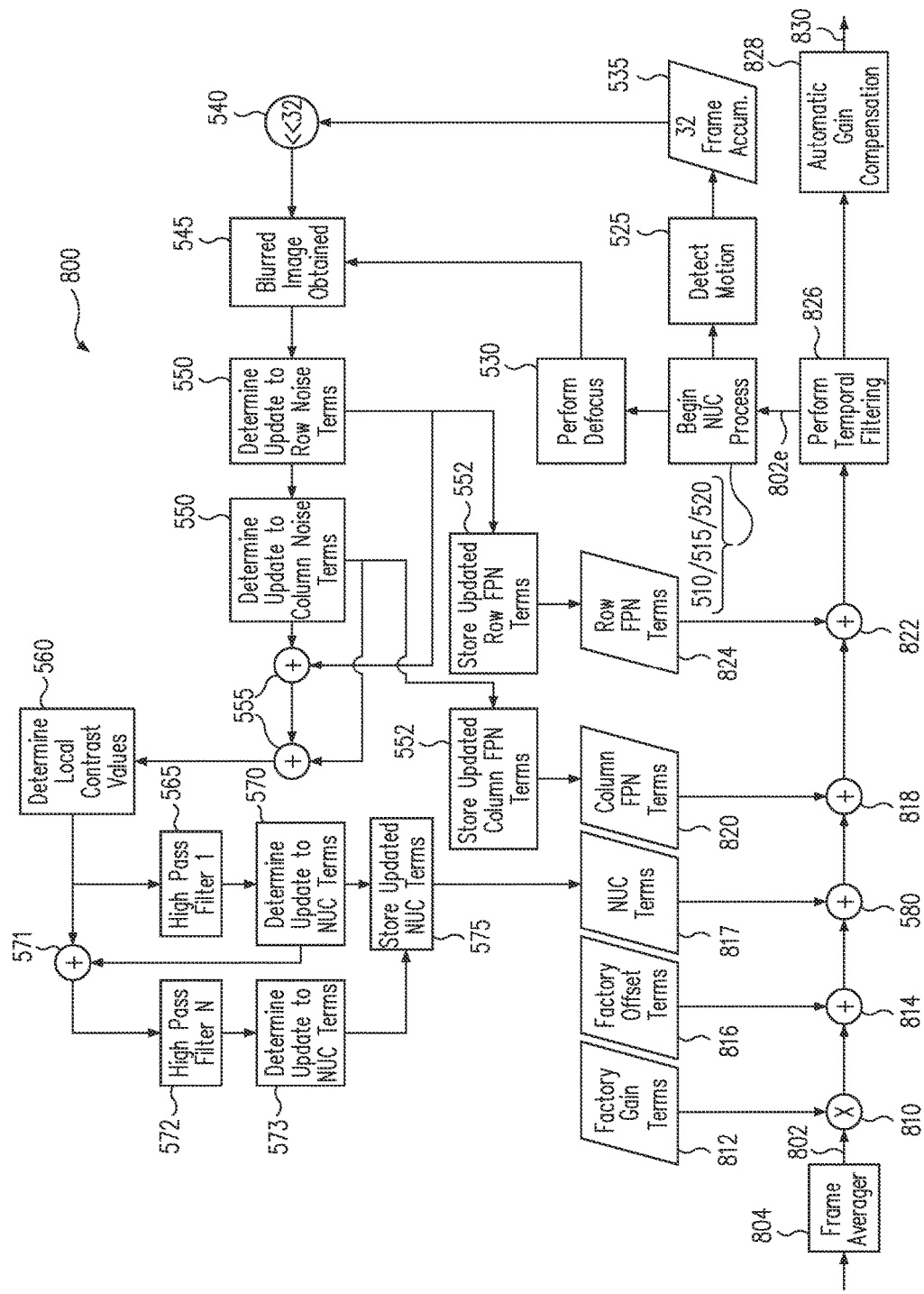
FIG. 8 illustrates various image processing techniques of FIG. 5 and other operations applied in an image processing pipeline in accordance with an embodiment of the disclosure.

FIG. 8 illustrates various image processing techniques of FIG. 5 and other operations applied in an image processing pipeline 800 in accordance with an embodiment of the disclosure. In this regard, pipeline 800 identifies various operations of FIG. 5 in the context of an overall iterative image processing scheme for correcting image frames provided by infrared imaging module 100. In some embodiments, pipeline 800 may be provided by processing module 160 or processor 195 (both also generally referred to as a processor) operating on image frames captured by infrared sensors 132.

Image frames captured by infrared sensors 132 may be provided to a frame averager 804 that integrates multiple image frames to provide image frames 802 with an improved signal to noise ratio. Frame averager 804 may be effectively provided by infrared sensors 132, ROIC 402, and other components of infrared sensor assembly 128 that are implemented to support high image capture rates. For example, in one embodiment, infrared sensor assembly 128 may capture infrared image frames at a frame rate of 240 Hz (e.g., 240 images per second). In this embodiment, such a high frame rate may be implemented, for example, by operating infrared sensor assembly 128 at relatively low voltages (e.g., compatible with mobile telephone voltages) and by using a relatively small array of infrared sensors 132 (e.g., an array of 64 by 64 infrared sensors in one embodiment).

In one embodiment, such infrared image frames may be provided from infrared sensor assembly 128 to processing module 160 at a high frame rate (e.g., 240 Hz or other frame rates). In another embodiment, infrared sensor assembly 128 may integrate over longer time periods, or multiple time periods, to provide integrated (e.g., averaged) infrared image frames to processing module 160 at a lower frame rate (e.g., 30 Hz, 9 Hz, or other frame rates). Further information regarding implementations that may be used to provide high image capture rates may be found in U.S. Provisional Patent Application No. 61/495,879 previously referenced herein.

Image frames 802 proceed through pipeline 800 where they are adjusted by various terms, temporally filtered, used to determine the various adjustment terms, and gain compensated.

In blocks 810 and 814, factory gain terms 812 and factory offset terms 816 are applied to image frames 802 to compensate for gain and offset differences, respectively, between the various infrared sensors 132 and/or other components of infrared imaging module 100 determined during manufacturing and testing.

In block 580, NUC terms 817 are applied to image frames 802 to correct for FPN as discussed. In one embodiment, if NUC terms 817 have not yet been determined (e.g., before a NUC process has been initiated), then block 580 may not be performed or initialization values may be used for NUC terms 817 that result in no alteration to the image data (e.g., offsets for every pixel would be equal to zero).

In blocks 818 and 822, column FPN terms 820 and row FPN terms 824, respectively, are applied to image frames 802. Column FPN terms 820 and row FPN terms 824 may be determined in accordance with block 550 as discussed. In one embodiment, if the column FPN terms 820 and row FPN terms 824 have not yet been determined (e.g., before a NUC process has been initiated), then blocks 818 and 822 may not be performed or initialization values may be used for the column FPN terms 820 and row FPN terms 824 that result in no alteration to the image data (e.g., offsets for every pixel would be equal to zero).

Figure 9:
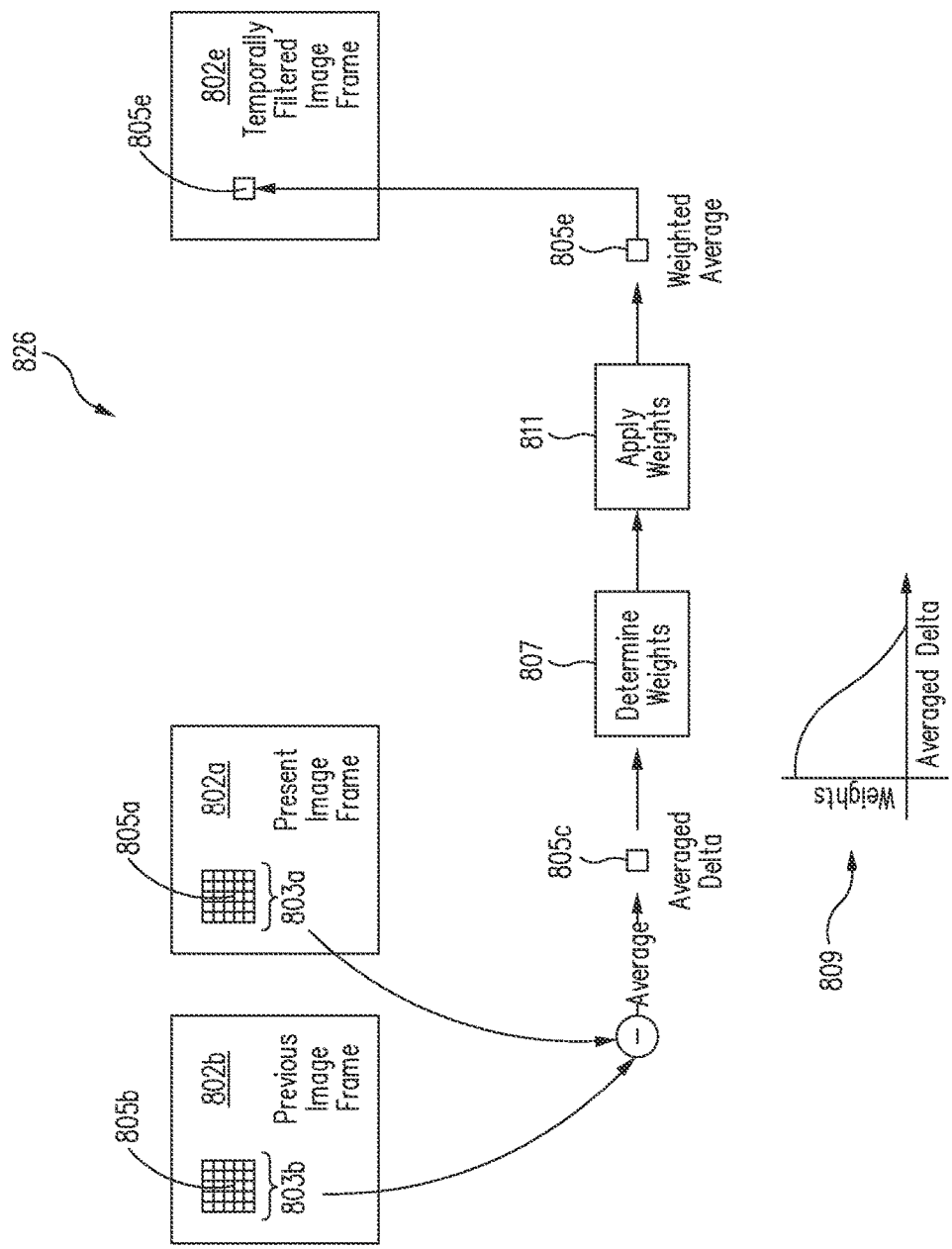
FIG. 9 illustrates a temporal noise reduction process in accordance with an embodiment of the disclosure.

In block 826, temporal filtering is performed on image frames 802 in accordance with a temporal noise reduction (TNR) process. FIG. 9 illustrates a TNR process in accordance with an embodiment of the disclosure. In FIG. 9, a presently received image frame 802a and a previously temporally filtered image frame 802b are processed to determine a new temporally filtered image frame 802e. Image frames 802a and 802b include local neighborhoods of pixels 803a and 803b centered around pixels 805a and 805b, respectively. Neighborhoods 803a and 803b correspond to the same locations within image frames 802a and 802b and are subsets of the total pixels in image frames 802a and 802b. In the illustrated embodiment, neighborhoods 803a and 803b include areas of 5 by 5 pixels. Other neighborhood sizes may be used in other embodiments.

Differences between corresponding pixels of neighborhoods 803a and 803b are determined and averaged to provide an averaged delta value 805c for the location corresponding to pixels 805a and 805b. Averaged delta value 805c may be used to determine weight values in block 807 to be applied to pixels 805a and 805b of image frames 802a and 802b.

In one embodiment, as shown in graph 809, the weight values determined in block 807 may be inversely proportional to averaged delta value 805c such that weight values drop rapidly towards zero when there are large differences between neighborhoods 803a and 803b. In this regard, large differences between neighborhoods 803a and 803b may indicate that changes have occurred within the scene (e.g., due to motion) and pixels 802a and 802b may be appropriately weighted, in one embodiment, to avoid introducing blur across frame-to-frame scene changes. Other associations between weight values and averaged delta value 805c may be used in various embodiments.

The weight values determined in block 807 may be applied to pixels 805a and 805b to determine a value for corresponding pixel 805e of image frame 802e (block 811). In this regard, pixel 805e may have a value that is a weighted average (or other combination) of pixels 805a and 805b, depending on averaged delta value 805c and the weight values determined in block 807.

For example, pixel 805e of temporally filtered image frame 802e may be a weighted sum of pixels 805a and 805b of image frames 802a and 802b. If the average difference between pixels 805a and 805b is due to noise, then it may be expected that the average change between neighborhoods 805a and 805b will be close to zero (e.g., corresponding to the average of uncorrelated changes). Under such circumstances, it may be expected that the sum of the differences between neighborhoods 805a and 805b will be close to zero. In this case, pixel 805a of image frame 802a may both be appropriately weighted so as to contribute to the value of pixel 805e.

However, if the sum of such differences is not zero (e.g., even differing from zero by a small amount in one embodiment), then the changes may be interpreted as being attributed to motion instead of noise. Thus, motion may be detected based on the average change exhibited by neighborhoods 805a and 805b. Under these circumstances, pixel 805a of image frame 802a may be weighted heavily, while pixel 805b of image frame 802b may be weighted lightly.

Other embodiments are also contemplated. For example, although averaged delta value 805c has been described as being determined based on neighborhoods 805a and 805b, in other embodiments averaged delta value 805c may be determined based on any desired criteria (e.g., based on individual pixels or other types of groups of sets of pixels).

In the above embodiments, image frame 802a has been described as a presently received image frame and image frame 802b has been described as a previously temporally filtered image frame. In another embodiment, image frames 802a and 802b may be first and second image frames captured by infrared imaging module 100 that have not been temporally filtered.

Figure 10:
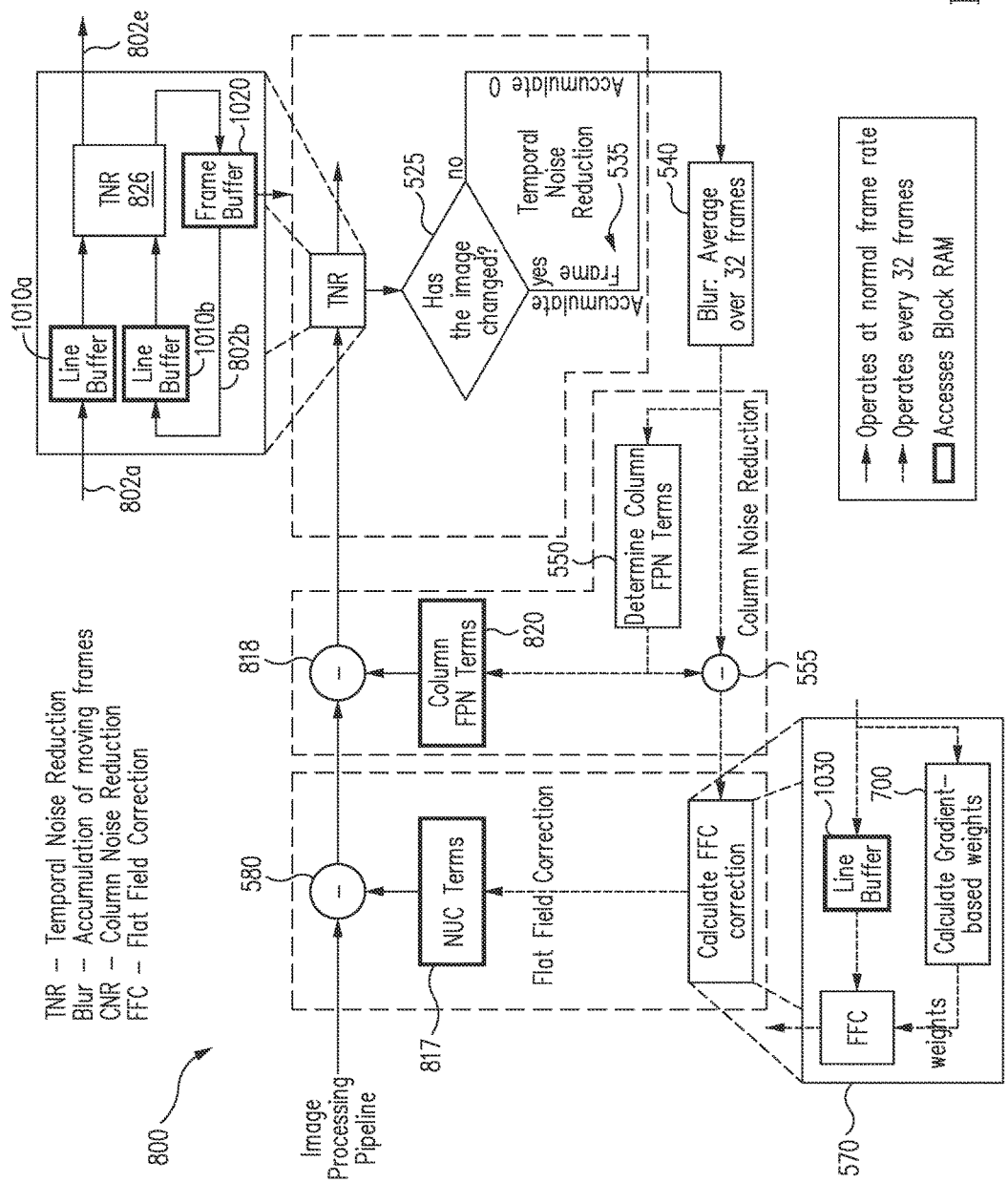
FIG. 10 illustrates particular implementation details of several processes of the image processing pipeline of FIG. 8 in accordance with an embodiment of the disclosure.

FIG. 10 illustrates further implementation details in relation to the TNR process of block 826. As shown in FIG. 10, image frames 802a and 802b may be read into line buffers 1010a and 1010b, respectively, and image frame 802b (e.g., the previous image frame) may be stored in a frame buffer 1020 before being read into line buffer 1010b. In one embodiment, line buffers 1010a-b and frame buffer 1020 may be implemented by a block of random access memory (RAM) provided by any appropriate component of infrared imaging module 100 and/or host device 102.

Referring again to FIG. 8, image frame 802e may be passed to an automatic gain compensation block 828 for further processing to provide a result image frame 830 that may be used by host device 102 as desired.

FIG. 8 further illustrates various operations that may be performed to determine row and column FPN terms and NUC terms as discussed. In one embodiment, these operations may use image frames 802e as shown in FIG. 8. Because image frames 802e have already been temporally filtered, at least some temporal noise may be removed and thus will not inadvertently affect the determination of row and column FPN terms 824 and 820 and NUC terms 817. In another embodiment, non-temporally filtered image frames 802 may be used.

In FIG. 8, blocks 510, 515, and 520 of FIG. 5 are collectively represented together. As discussed, a NUC process may be selectively initiated and performed in response to various NUC process initiating events and based on various criteria or conditions. As also discussed, the NUC process may be performed in accordance with a motion-based approach (blocks 525, 535, and 540) or a defocus-based approach (block 530) to provide a blurred image frame (block 545). FIG. 8 further illustrates various additional blocks 550, 552, 555, 560, 565, 570, 571, 572, 573, and 575 previously discussed with regard to FIG. 5.

As shown in FIG. 8, row and column FPN terms 824 and 820 and NUC terms 817 may be determined and applied in an iterative fashion such that updated terms are determined using image frames 802 to which previous terms have already been applied. As a result, the overall process of FIG. 8 may repeatedly update and apply such terms to continuously reduce the noise in image frames 830 to be used by host device 102.

Referring again to FIG. 10, further implementation details are illustrated for various blocks of FIGS. 5 and 8 in relation to pipeline 800. For example, blocks 525, 535, and 540 are shown as operating at the normal frame rate of image frames 802 received by pipeline 800. In the embodiment shown in FIG. 10, the determination made in block 525 is represented as a decision diamond used to determine whether a given image frame 802 has sufficiently changed such that it may be considered an image frame that will enhance the blur if added to other image frames and is therefore accumulated (block 535 is represented by an arrow in this embodiment) and averaged (block 540).

Also in FIG. 10, the determination of column FPN terms 820 (block 550) is shown as operating at an update rate that in this example is 1/32 of the sensor frame rate (e.g., normal frame rate) due to the averaging performed in block 540. Other update rates may be used in other embodiments. Although only column FPN terms 820 are identified in FIG. 10, row FPN terms 824 may be implemented in a similar fashion at the reduced frame rate.

FIG. 10 also illustrates further implementation details in relation to the NUC determination process of block 570. In this regard, the blurred image frame may be read to a line buffer 1030 (e.g., implemented by a block of RAM provided by any appropriate component of infrared imaging module 100 and/or host device 102). The flat field correction technique 700 of FIG. 7 may be performed on the blurred image frame.

In view of the present disclosure, it will be appreciated that techniques described herein may be used to remove various types of FPN (e.g., including very high amplitude FPN) such as spatially correlated row and column FPN and spatially uncorrelated FPN.

Other embodiments are also contemplated. For example, in one embodiment, the rate at which row and column FPN terms and/or NUC terms are updated can be inversely proportional to the estimated amount of blur in the blurred image frame and/or inversely proportional to the magnitude of local contrast values (e.g., determined in block 560).

In various embodiments, the described techniques may provide advantages over conventional shutter-based noise correction techniques. For example, by using a shutterless process, a shutter (e.g., such as shutter 105) need not be provided, thus permitting reductions in size, weight, cost, and mechanical complexity. Power and maximum voltage supplied to, or generated by, infrared imaging module 100 may also be reduced if a shutter does not need to be mechanically operated. Reliability will be improved by removing the shutter as a potential point of failure. A shutterless process also eliminates potential image interruption caused by the temporary blockage of the imaged scene by a shutter.

Also, by correcting for noise using intentionally blurred image frames captured from a real world scene (not a uniform scene provided by a shutter), noise correction may be performed on image frames that have irradiance levels similar to those of the actual scene desired to be imaged. This can improve the accuracy and effectiveness of noise correction terms determined in accordance with the various described techniques.

As discussed, in various embodiments, infrared imaging module 100 may be configured to operate at low voltage levels. In particular, infrared imaging module 100 may be implemented with circuitry configured to operate at low power and/or in accordance with other parameters that permit infrared imaging module 100 to be conveniently and effectively implemented in various types of host devices 102, such as mobile devices and other devices.

Figure 12:
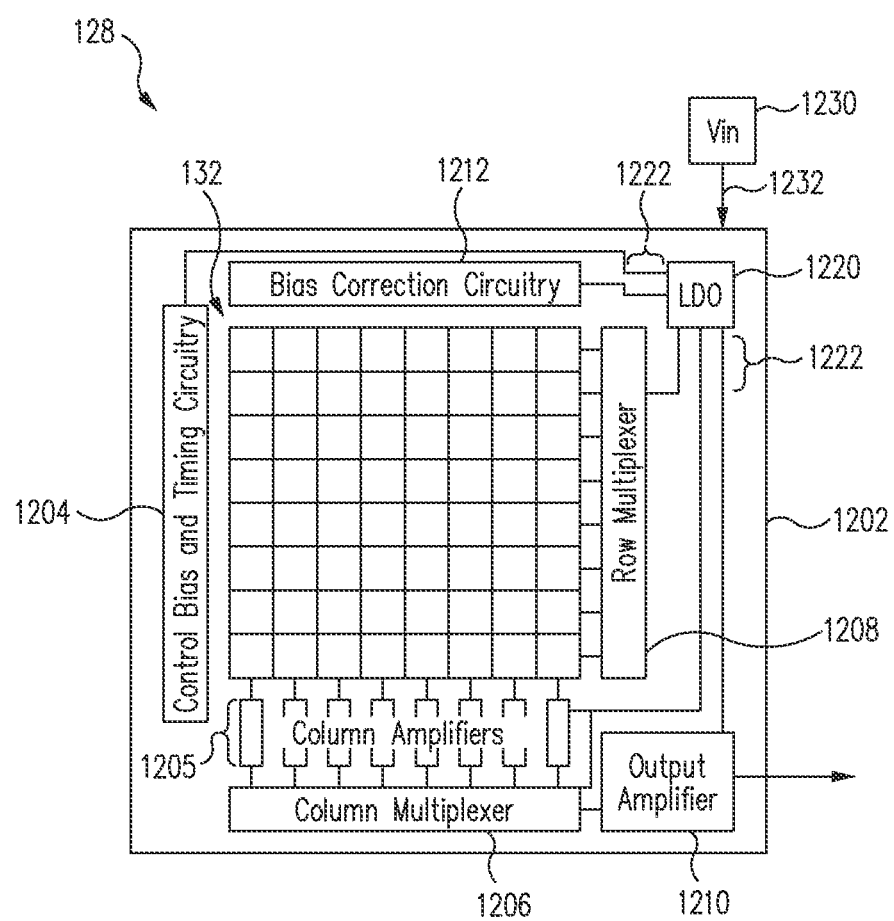
FIG. 12 illustrates a block diagram of another implementation of an infrared sensor assembly including an array of infrared sensors and a low-dropout regulator in accordance with an embodiment of the disclosure.

For example, FIG. 12 illustrates a block diagram of another implementation of infrared sensor assembly 128 including infrared sensors 132 and an LDO 1220 in accordance with an embodiment of the disclosure. As shown, FIG. 12 also illustrates various components 1202, 1204, 1205, 1206, 1208, and 1210 which may implemented in the same or similar manner as corresponding components previously described with regard to FIG. 4. FIG. 12 also illustrates bias correction circuitry 1212 which may be used to adjust one or more bias voltages provided to infrared sensors 132 (e.g., to compensate for temperature changes, self-heating, and/or other factors).

In some embodiments, LDO 1220 may be provided as part of infrared sensor assembly 128 (e.g., on the same chip and/or wafer level package as the ROIC). For example, LDO 1220 may be provided as part of an FPA with infrared sensor assembly 128. As discussed, such implementations may reduce power supply noise introduced to infrared sensor assembly 128 and thus provide an improved PSRR. In addition, by implementing the LDO with the ROIC, less die area may be consumed and fewer discrete die (or chips) are needed.

LDO 1220 receives an input voltage provided by a power source 1230 over a supply line 1232. LDO 1220 provides an output voltage to various components of infrared sensor assembly 128 over supply lines 1222. In this regard, LDO 1220 may provide substantially identical regulated output voltages to various components of infrared sensor assembly 128 in response to a single input voltage received from power source 1230.

For example, in some embodiments, power source 1230 may provide an input voltage in a range of approximately 2.8 volts to approximately 11 volts (e.g., approximately 2.8 volts in one embodiment), and LDO 1220 may provide an output voltage in a range of approximately 1.5 volts to approximately 2.8 volts (e.g., approximately 2.5 volts in one embodiment). In this regard, LDO 122.0 may be used to provide a consistent regulated output voltage, regardless of whether power source 1230 is implemented with a conventional voltage range of approximately 9 volts to approximately 11 volts, or a low voltage such as approximately 2.8 volts. As such, although various voltage ranges are provided for the input and output voltages, it is contemplated that the output voltage of LDO 1220 will remain fixed despite changes in the input voltage.

The implementation of LDO 1220 as part of infrared sensor assembly 128 provides various advantages over conventional power implementations for FPAs. For example, conventional FPAs typically rely on multiple power sources, each of which may be provided separately to the FPA, and separately distributed to the various components of the FPA. By regulating a single power source 1230 by LDO 1220, appropriate voltages may be separately provided (e.g., to reduce possible noise) to all components of infrared sensor assembly 128 with reduced complexity. The use of LDO 1220 also allows infrared sensor assembly 128 to operate in a consistent manner, even if the input voltage from power source 1230 changes (e.g., if the input voltage increases or decreases as a result of charging or discharging a battery or other type of device used for power source 1230).

The various components of infrared sensor assembly 128 shown in FIG. 12 may also be implemented to operate at lower voltages than conventional devices. For example, as discussed, LDO 1220 may be implemented to provide a low voltage (e.g., approximately 2.5 volts). This contrasts with the multiple higher voltages typically used to power conventional FPAs, such as: approximately 3.3 volts to approximately 5 volts used to power digital circuitry; approximately 3.3 volts used to power analog circuitry; and approximately 9 volts to approximately 11 volts used to power loads. Also, in some embodiments, the use of LDO 1220 may reduce or eliminate the need for a separate negative reference voltage to be provided to infrared sensor assembly 128.

Figure 13:
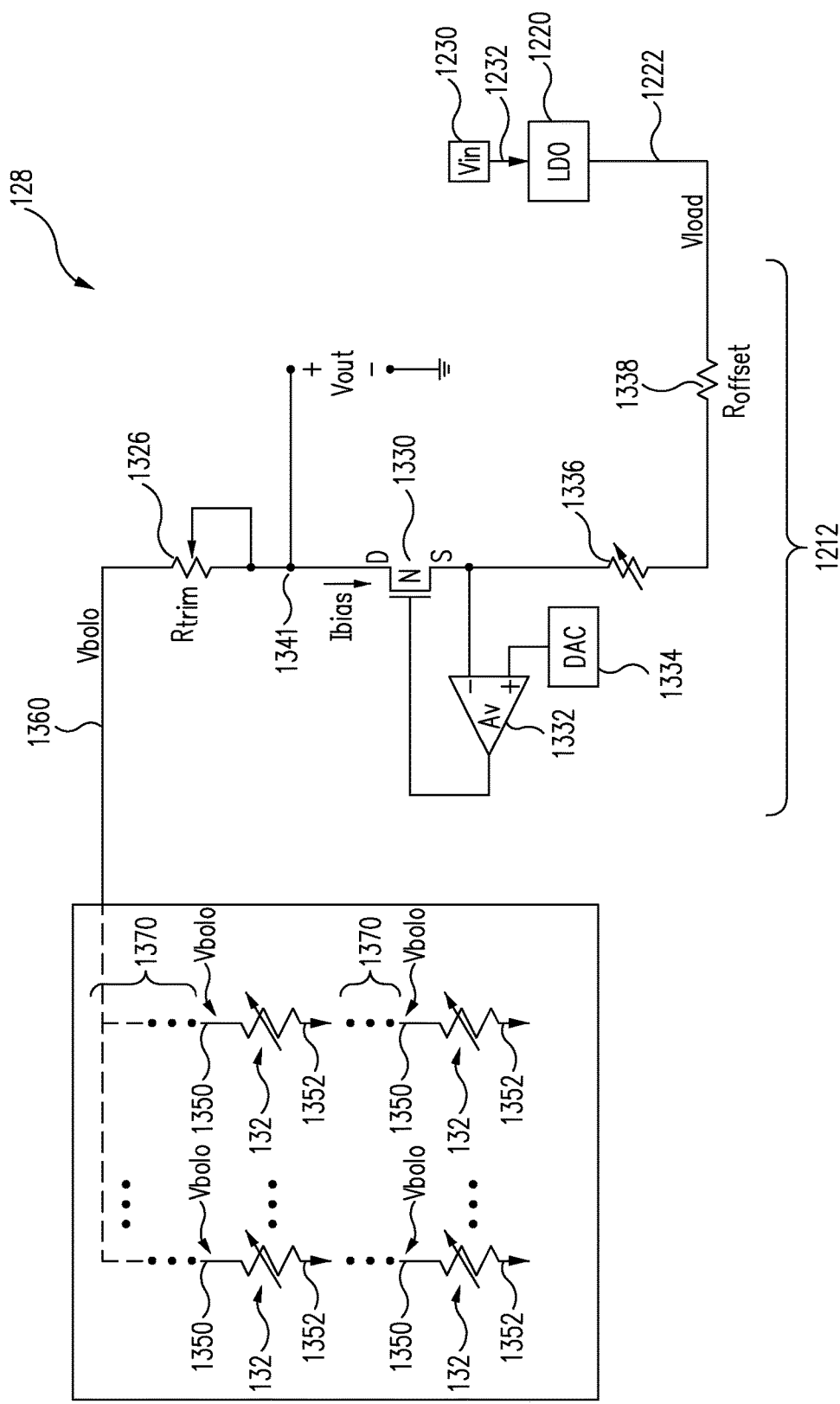
FIG. 13 illustrates a circuit diagram of a portion of the infrared sensor assembly of FIG. 12 in accordance with an embodiment of the disclosure.

Additional aspects of the low voltage operation of infrared sensor assembly 128 may be further understood with reference to FIG. 13. FIG. 13 illustrates a circuit diagram of a portion of infrared sensor assembly 128 of FIG. 12 in accordance with an embodiment of the disclosure. In particular, FIG. 13 illustrates additional components of bias correction circuitry 1212 (e.g., components 1326, 1330, 1332, 1334, 1336, 1338, and 1341) connected to LDO 1220 and infrared sensors 132. For example, bias correction circuitry 1212 may be used to compensate for temperature-dependent changes in bias voltages in accordance with an embodiment of the present disclosure. The operation of such additional components may be further understood with reference to similar components identified in U.S. Pat. No. 7,679,048 issued Mar. 16, 2010 which is hereby incorporated by reference in its entirety. Infrared sensor assembly 128 may also be implemented in accordance with the various components identified in U.S. Pat. No. 6,812,465 issued Nov. 2, 2004 which is hereby incorporated by reference in its entirety.

In various embodiments, some or all of the bias correction circuitry 1212 may be implemented on a global array basis as shown in FIG. 13 (e.g., used for all infrared sensors 132 collectively in an array). In other embodiments, some or all of the bias correction circuitry 1212 may be implemented an individual sensor basis (e.g., entirely or partially duplicated for each infrared sensor 132). In some embodiments, bias correction circuitry 1212 and other components of FIG. 13 may be implemented as part of ROIC 1202.

As shown in FIG. 13, LDO 1220 provides a load voltage Vload to bias correction circuitry 1212 along one of supply lines 1222. As discussed, in some embodiments, Vload may be approximately 2.5 volts which contrasts with larger voltages of approximately 9 volts to approximately 11 volts that may be used as load voltages in conventional infrared imaging devices.

Based on Vload, bias correction circuitry 1212 provides a sensor bias voltage Vbolo at a node 1360. Vbolo may be distributed to one or more infrared sensors 132 through appropriate switching circuitry 1370 (e.g., represented by broken lines in FIG. 13). In some examples, switching circuitry 1370 may be implemented in accordance with appropriate components identified in U.S. Pat. Nos. 6,812,465 and 7,679,048 previously referenced herein.

Each infrared sensor 132 includes a node 1350 which receives Vbolo through switching circuitry 1370, and another node 1352 which may be connected to ground, a substrate, and/or a negative reference voltage. In some embodiments, the voltage at node 1360 may be substantially the same as Vbolo provided at nodes 1350. In other embodiments, the voltage at node 1360 may be adjusted to compensate for possible voltage drops associated with switching circuitry 1370 and/or other factors.

Vbolo may be implemented with lower voltages than are typically used for conventional infrared sensor biasing. In one embodiment, Vbolo may be in a range of approximately 0.2 volts to approximately 0.7 volts. In another embodiment, Vbolo may be in a range of approximately 0.4 volts to approximately 0.6 volts. In another embodiment, Vbolo may be approximately 0.5 volts. In contrast, conventional infrared sensors typically use bias voltages of approximately 1 volt.

The use of a lower bias voltage for infrared sensors 132 in accordance with the present disclosure permits infrared sensor assembly 128 to exhibit significantly reduced power consumption in comparison with conventional infrared imaging devices. In particular, the power consumption of each infrared sensor 132 is reduced by the square of the bias voltage. As a result, a reduction from, for example, 1.0 volt to 0.5 volts provides a significant reduction in power, especially when applied to many infrared sensors 132 in an infrared sensor array. This reduction in power may also result in reduced self-heating of infrared sensor assembly 128.

In accordance with additional embodiments of the present disclosure, various techniques are provided for reducing the effects of noise in image frames provided by infrared imaging devices operating at low voltages. In this regard, when infrared sensor assembly 128 is operated with low voltages as described, noise, self-heating, and/or other phenomena may, if uncorrected, become more pronounced in image frames provided by infrared sensor assembly 128.

For example, referring to FIG. 13, when LDO 1220 maintains Vload at a low voltage in the manner described herein, Vbolo will also be maintained at its corresponding low voltage and the relative size of its output signals may be reduced. As a result, noise, self-heating, and/or other phenomena may have a greater effect on the smaller output signals read out from infrared sensors 132, resulting in variations (e.g., errors) in the output signals. If uncorrected, these variations may be exhibited as noise in the image frames. Moreover, although low voltage operation may reduce the overall amount of certain phenomena (e.g., self-heating), the smaller output signals may permit the remaining error sources (e.g., residual self-heating) to have a disproportionate effect on the output signals during low voltage operation.

To compensate for such phenomena, infrared sensor assembly 128, infrared imaging module 100, and/or host device 102 may be implemented with various array sizes, frame rates, and/or frame averaging techniques. For example, as discussed, a variety of different array sizes are contemplated for infrared sensors 132. In some embodiments, infrared sensors 132 may be implemented with array sizes ranging from 32 by 32 to 160 by 120 infrared sensors 132. Other example array sizes include 80 by 64, 80 by 60, 64 by 64, and 64 by 32. Any desired array size may be used.

Advantageously, when implemented with such relatively small array sizes, infrared sensor assembly 128 may provide image frames at relatively high frame rates without requiring significant changes to ROIC and related circuitry. For example, in some embodiments, frame rates may range from approximately 120 Hz to approximately 480 Hz.

In some embodiments, the array size and the frame rate may be scaled relative to each other (e.g., in an inversely proportional manner or otherwise) such that larger arrays are implemented with lower frame rates, and smaller arrays are implemented with higher frame rates. For example, in one embodiment, an array of 160 by 120 may provide a frame rate of approximately 120 Hz. In another embodiment, an array of 80 by 60 may provide a correspondingly higher frame rate of approximately 240 Hz. Other frame rates are also contemplated.

By scaling the array size and the frame rate relative to each other, the particular readout timing of rows and/or columns of the FPA may remain consistent, regardless of the actual FPA size or frame rate. In one embodiment, the readout timing may be approximately 63 microseconds per row or column.

As previously discussed with regard to FIG. 8, the image frames captured by infrared sensors 132 may be provided to a frame averager 804 that integrates multiple image frames to provide image frames 802 (e.g., processed image frames) with a lower frame rate (e.g., approximately 30 Hz, approximately 60 Hz, or other frame rates) and with an improved signal to noise ratio. In particular, by averaging the high frame rate image frames provided by a relatively small FPA, image noise attributable to low voltage operation may be effectively averaged out and/or substantially reduced in image frames 802. Accordingly, infrared sensor assembly 128 may be operated at relatively low voltages provided by LDO 1220 as discussed without experiencing additional noise and related side effects in the resulting image frames 802 after processing by frame averager 804.

Other embodiments are also contemplated. For example, although a single array of infrared sensors 132 is illustrated, it is contemplated that multiple such arrays may be used together to provide higher resolution image frames (e.g., a scene may be imaged across multiple such arrays). Such arrays may be provided in multiple infrared sensor assemblies 128 and/or provided in the same infrared sensor assembly 128. Each such array may be operated at low voltages as described, and also may be provided with associated ROIC circuitry such that each array may still be operated at a relatively high frame rate. The high frame rate image frames provided by such arrays may be averaged by shared or dedicated frame averagers 804 to reduce and/or eliminate noise associated with low voltage operation. As a result, high resolution infrared images may be obtained while still operating at low voltages.

In various embodiments, infrared sensor assembly 128 may be implemented with appropriate dimensions to permit infrared imaging module 100 to be used with a small form factor socket 104, such as a socket used for mobile devices. For example, in some embodiments, infrared sensor assembly 128 may be implemented with a die size in a range of approximately 4.0 mm by approximately 4.0 mm to approximately 5.5 mm by approximately 5.5 mm (e.g., approximately 4.0 mm by approximately 5.5 mm in one example). Infrared sensor assembly 128 may be implemented with such sizes or other appropriate sizes to permit use with socket 104 implemented with various sizes such as: 8.5 mm by 8.5 mm, 8.5 mm by 5.9 mm, 6.0 mm by 6.0 mm, 5.5 mm by 5.5 mm, 4.5 mm by 4.5 mm, and/or other socket sizes such as, for example, those identified in Table 1 of U.S. Provisional Patent Application No. 61/495,873 previously referenced herein;

In some embodiments, infrared sensor assembly 128 illustrated in FIGS. 4, 12, and 13 above may include various analog components and digital components, the timing of which may be associated with a clock signal to generate infrared image frames at a specified frame rate. For example, infrared sensor assembly 128 may receive a clock signal through bond pads 142 or other suitable paths. In various embodiments, the received clock signal may be distributed to various components including, bias generation and timing control circuitry 404/1204 for example, to control and synchronize the operation of infrared sensor assembly 128. As described above with respect to FIG. 8, in various embodiments, infrared sensor assembly 128 may be configured to capture infrared image frames at a set frame rate as desired (e.g., at a high frame rate of 240 Hz, or lower frame rates of 30 Hz, 9 Hz, or other frame rates) based on the received clock signal. As such, the resulting frame rate may deviate from the set frame rate if the clock signal has a frequency (e.g., clock rate) that deviates from a predetermined (e.g., expected) frequency.

As will now be described, infrared sensor assembly 128 in various embodiments may include a clock rate detection circuit that can detect whether the clock signal has a clock rate within an expected range or not, so as to ensure that infrared sensor assembly 128 captures infrared image frames at a specified frame rate and/or ensure that other operations of infrared sensor assembly 128 are performed correctly, for example. In various embodiments, the clock rate detection circuit may be readily integrated as part of ROIC 402/1202 of infrared sensor assembly 128 to provide effective detection of an abnormal clock rate without excessive overhead (e.g., overhead in terms of space, power consumption, complexity, and/or other costs). In some embodiments, the clock rate detection circuit may take advantage of some portion of analog-to-digital converter (ADC) circuitry included in ROIC 402/1202 for some embodiments, which may further facilitate integration and further reduce complexity while providing effective detection.

Figure 14:
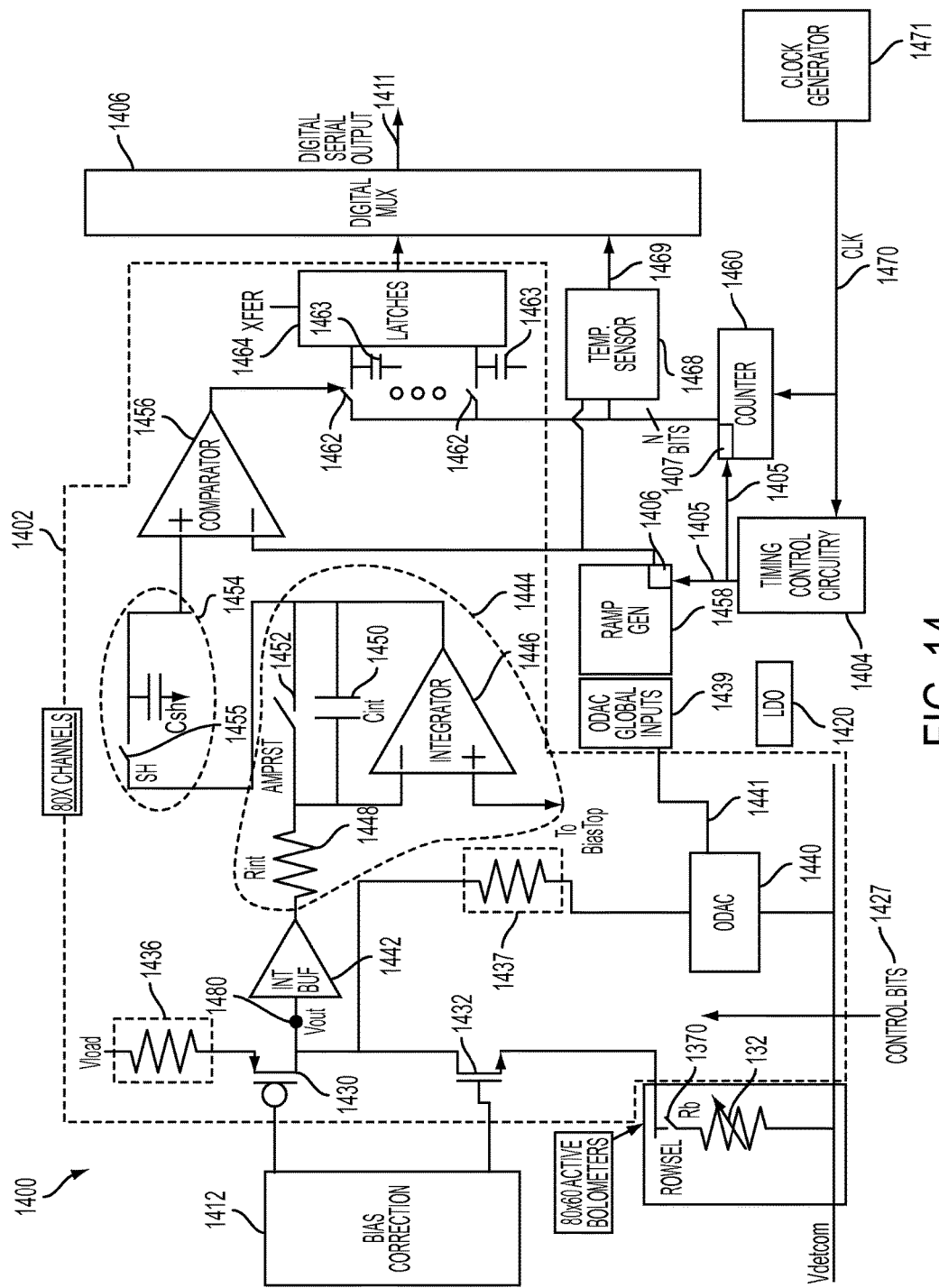
FIG. 14 illustrates a schematic diagram of a circuit of a portion of an infrared sensor assembly in accordance with an embodiment of the disclosure.

Various aspects of the clock rate detection circuit may be better understood with reference to FIG. 14. FIG. 14 illustrates a schematic diagram of a circuit 1400 of a portion of infrared sensor assembly 128, in accordance with an embodiment of the disclosure. It should be understood, however, that techniques disclosed herein are not limited to circuit 1400, but rather are applicable to various implementations of FPAs (e.g., including bolometers, unit cell circuits, and ROICs) or other imaging sensor arrays (e.g., visible light imaging devices, CMOS-based sensors and/or CCD-based sensors). For example, the clock rate detection circuit may be implemented in any one of the various implementations of FPA circuits described in U.S. Pat. Nos. 6,028,309, 6,812,465, 7,034,301, and 7,679,048 previously referenced herein, as would be understood by one skilled in the art.

Circuit 1400 may include a channel circuitry portion 1402, which may in turn include a plurality of per-channel (or per-column) blocks, for example, one per-channel block for each column of the array of infrared sensors 132. That is, for example, the components and circuits shown encircled as channel circuitry portion 1402 may be repeated and included for each column of the array as a per-channel block. In the illustrated embodiment of FIG. 14, eighty of such per-channel blocks are indicated in channel circuitry portion 1402. However, as discussed herein, the array of infrared sensors 132 may be of any size as desired for particular implementations, and hence the number of per-channel blocks in channel circuitry portion 1402 may vary for different implementations. Also, in yet other implementations, some components or circuits shown in channel circuitry portion 1402 may instead be shared by two or more columns of the array of infrared sensors 132 or by the entire array of infrared sensors 132 (e.g., one such component or circuit for the entire FPA). It should be appreciated that various techniques disclosed herein may be applied to such other implementations of circuit 1400 without departing from the scope and spirit of the disclosure.

Circuit 1400 may include timing control circuitry 1404 implemented in a similar manner as the timing control portion of bias generation and timing control circuitry 404/1204. Timing control circuitry 1404 may be adapted to control and synchronize the timing of various components of circuit 1400, based on a clock signal 1470 provided by a clock generator 1471 (e.g., implemented as part of or separate from infrared sensor assembly 128). In some embodiments, clock signal 1470 may be provided to circuit 1400 via bond pads 142 of infrared sensor assembly 128 or other paths, and may be distributed (e.g., via timing control circuitry 1404, a clock distribution tree, and/or other paths) to various components of infrared sensor assembly 128 that may utilize it.

In some embodiments, circuit 1400 may include a LDO 1420 implemented in a same or similar manner as LDO 1220 of FIGS. 12 and 13. As discussed, in accordance with one or more embodiments, LDO 1420 may be adapted to supply voltages regulated at desired levels to various components and circuits of infrared imaging sensor 128 where needed.

Circuit 1400 may include infrared sensors 132 and switching circuitry 1370 in accordance with one or more embodiments as described herein and more specifically with respect to FIG. 13. Switching circuitry 1370 and/or timing control circuitry 1404 may select a row of infrared sensors 132 (e.g., by closing switches to connect a selected row of infrared sensors 132 to channel circuitry portion 1402) based on clock signal 1470. In various embodiments, infrared sensors 132 may include active bolometers (labeled Rb and indicated by a bolometer symbol in FIG. 14) arranged in an array and adapted to receive infrared radiation attributable to a scene viewed by infrared sensor assembly 128. In the illustrated embodiment, an 80-by-60 array of active bolometers is indicated, which corresponds to sixty rows of active bolometers per each of the eighty per-channel blocks in channel circuitry portion 1402.

In some embodiments, circuit 1400 may include bias correction circuitry 1412, which may be implemented in a similar manner as bias correction circuitry 1212 described above with respect to FIGS. 12 and 13, or in any other suitable manner to adjust one or more bias voltages provided to infrared sensors 132 (e.g., to compensate for temperature changes, self-heating, and/or other variations). For example, depending on specific implementations, bias correction circuitry 1412 may appropriately bias the gates of one or more transistors (e.g., transistors 1430 and 1432 in the illustrated circuit 1400) to adjust the bias voltage applied to infrared sensors 132. In this regard, circuit 1400 in some embodiments may include one or more bolometers (e.g., bolometers 1436 and 1437) thermally shorted (or shunted) to a substrate (e.g., substrate 140) to act as temperature-compensated loads that may aid in compensating the bias voltage for substrate temperature variations.

In some embodiments, circuit 1400 may also include an offset digital-to-analog converter (DAC) 1440 adapted to vary the voltage and/or current in response to control bits 1641, and to provide offset correction. Control bits 1441 may be determined and stored, for example, in a memory 1439 of infrared sensor assembly 128 during a calibration procedure performed in accordance with various processes described in U.S. Pat. Nos. 6,028,309 and 6,812,465 previously referenced herein or other suitable calibration processes. In some embodiments, additional control bits 1427 may be utilized and provided to circuit 1400 to adjust various operating parameters associated with various components.

In terms of the general operation of circuit 1400, temperature changes experienced by infrared sensor 132 (e.g., an active bolometer of a selected row for a given column) changes its resistance, and thus resulting in a change in an output voltage Vout (e.g., at a node 1480 in the illustrated embodiment of FIG. 14). As described above, various components and/or circuits may be included in one or more embodiments to compensate for such temperature changes, self-heating, various mismatches, non-uniformities, and/or other variations.

A detected signal provided by infrared sensor 132 (e.g., the output voltage Vout at node 1480) may be buffered and/or amplified by a buffer 1442, according to some embodiments. The detected signal (e.g., amplified by buffer 1442 in some embodiments) may be integrated by an integrator 1444 to provide an analog signal. In some embodiments, integrator 1444 may be implemented using an op-amp 1446, a resistor 1448 (labeled Rint), a capacitor 1450 (labeled Cint), and a reset switch 1452. While one example implementation of integrator 1444 is shown in FIG. 14, any other suitable integrator or integrating circuitry may be utilized to implement integrator 1444.

In some embodiments, circuit 1400 may include a sample-and-hold circuit 1454 adapted to receive the analog signal (e.g., integrated detected signal) from integrator 1444. Sample-and-hold circuit 1454 may be utilized to capture (e.g., sample) a voltage in response to the analog signal, hold (e.g., maintain at a substantially constant level) the captured voltage, and provide the captured voltage for analog-to-digital conversion. The timing of sampling and holding may be controlled and synchronized based on clock signal 1470, for example, via associated switching circuitry 1455 and/or timing control circuitry 1404.

In various embodiments, circuit 1400 may include components to convert the captured voltage (e.g., the voltage held by sample-and-hold circuit 1454 in some embodiments) into a digital output value (e.g., by performing an analog-to-digital (A/D) conversion). In some embodiments, circuit 1400 may include a comparator 1456, a ramp generator 1458, a counter 1460, switches 1462, capacitors 1463 and latches 1464, which may be utilized to perform the A/D conversion. More specifically, for example, ramp generator 1458 may be adapted to generate a ramp signal 1459 (e.g., a saw-tooth signal that ramps up or down and then quickly returns to zero or a base value in one embodiment). In various embodiments, ramp generator 1656 may be implemented using an oscillator, an integrator, and/or other conventional components and circuits suitable for generating a ramp signal having a slope (e.g., a rate of change or ramp rate) that does not rely on (e.g., is independent of) clock signal 1470.

In various embodiments, counter 1460 may be implemented using a binary counter, a Gray code counter, or other conventional digital counter adapted to increment (or decrement) a count value (e.g., encoded in one or more count signals) having N number of bits (e.g., 12 bits, 13 bits, 14 bits, or other specified number of bits) in response to clock signal 1470. In some embodiments, the count value adjusted (e.g., incremented or decremented) by counter 1460 may have a substantially similar period (e.g., resets to zero or a base value at a substantially same time) as ramp signal 1459. For example, in some embodiments, ramp generator 1458 and counter 1460 may include reset switches 1406 and 1407, respectively, which may be adapted to receive a reset signal 1405 from timing control circuitry 1404 and to restart ramp signal 1459 (e.g., from a base level) and the count value (e.g., from a base value), respectively, in response to reset signal 1405. In another embodiment, counter 1460 may generate reset signal 1405 for ramp generator 1458 when the count value restarts, so that ramp generator 1458 and counter 1460 can restart at substantially the same time.

In the illustrated example, comparator 1456 may be adapted to receive the captured voltage from sample-and-hold circuit 1454 and ramp signal 1459 from ramp generator 1458, and to compare the voltage and ramp signal 1459 to trigger (e.g., generate a signal to close switches 1462) when ramp signal 1459 substantially matches the voltage. When comparator 1456 triggers, the current count value may be selected and stored in latches 1464 as a digital value. In some embodiments, circuit 1400 may include a multiplexer 1406, which may be utilized to multiplex the digital values stored in latches 1464 for each channel/column to generate a digital output signal 1411 (e.g., a serial digital output signal including digital output values corresponding to the IR radiation received at infrared sensors 132).

Although in FIG. 14, comparator 1456, switches 1462, and latches 1464 are shown as being included in channel circuitry portion 1402 and repeated for each column, these components may be implemented outside channel circuitry 1402 on a global array basis (e.g., shared by all infrared sensors 132 or by infrared sensors 132 in a group of columns) in other embodiments. Also, in other embodiments, circuit 1400 may alternatively include other analog-to-digital converter implementations suitable for converting the voltage from sample-and-hold circuit 1454 to a digital value.

In some embodiments, circuit 1400 may include a temperature sensor 1468 adapted to obtain an ambient temperature reading associated with infrared sensor assembly 128. In some embodiments, the temperature reading may be provided as a temperature count 1469 further described herein. Such an ambient temperature reading may be utilized in performing various calibration processes. In one embodiment, temperature sensor 1468 may be disposed in close proximity to infrared sensors 132, thermally shorted bolometer 1436, and/or thermally shorted bolometer 1437, so that the temperature reading obtained by temperature sensor 1468 may closely track the temperature of these components. In one embodiment, temperature sensor 1468 and multiplexer 1406 may be adapted to multiplex the ambient temperature reading into digital output signal 1411, so that the ambient temperature reading may be accessed by components external to infrared sensor assembly 128 (e.g., by processing module 160 and/or processor 195 described herein). Thus, for example, external components such as processing module 160 and/or processor 195 may be adapted to compensate for temperature-dependent characteristics of various components of circuit 1400 using the ambient temperature reading.

Figure 15:
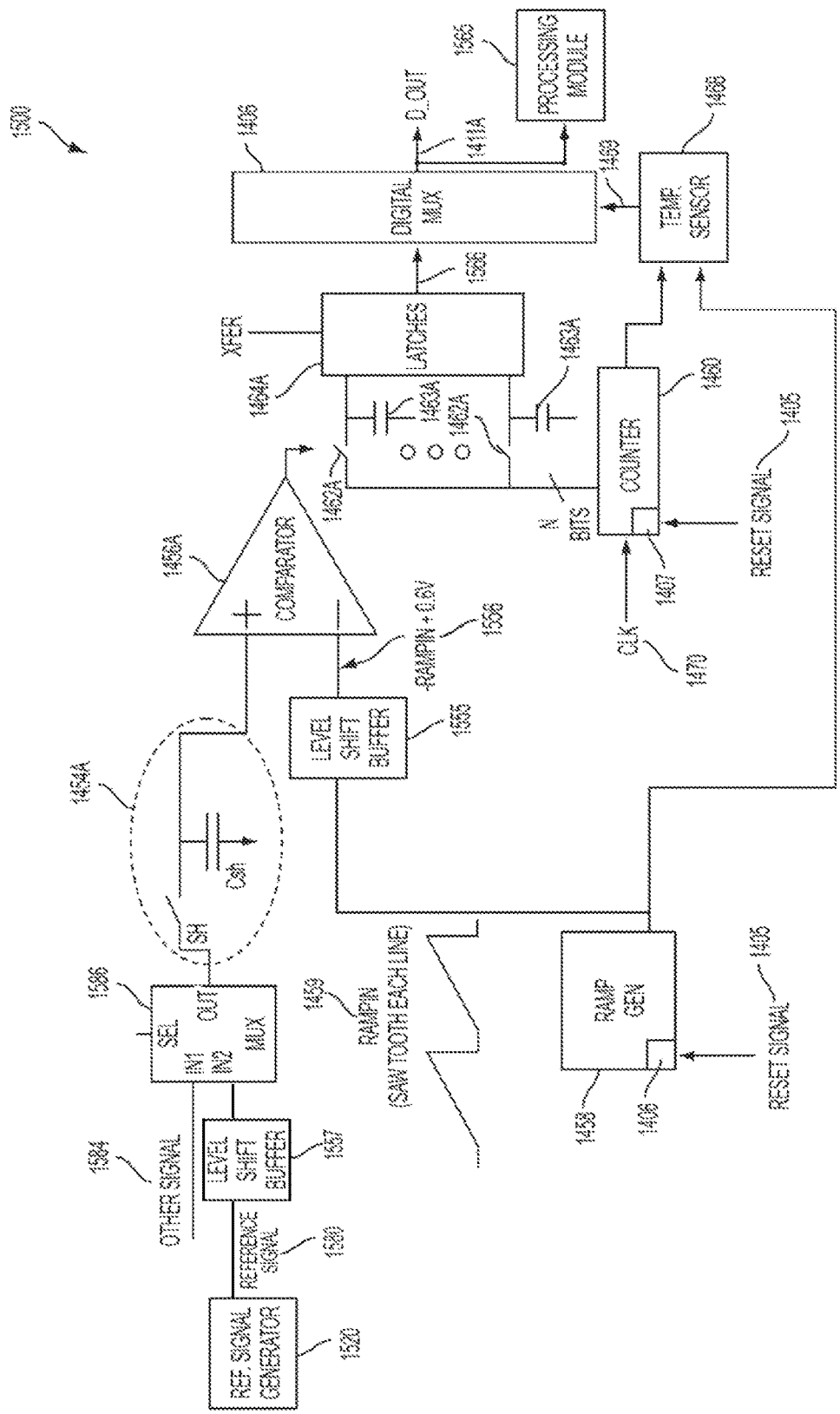
FIG. 15 illustrates a schematic diagram of a circuit to detect an abnormal clock rate provided to an infrared sensor assembly in accordance with an embodiment of the disclosure.

A clock rate detection circuit, which may be integrated into (e.g., implemented as part of) circuit 1400 to provide efficient and effective detection of an abnormal clock rate, will now be described with reference to FIG. 15. FIG. 15 illustrates a schematic circuit diagram of a clock rate detection circuit 1500 that may be integrated into circuit 1400 to detect whether clock signal 1470 has a clock rate within an expected range or not, in accordance with an embodiment of the disclosure. In various embodiments, clock rate detection circuit 1500 may share or utilize various components of circuit 1400, including those components such as ramp generator 1458, counter 1460, multiplexer 1406, and other components associated with the A/D conversion and/or the generation of digital output signal 1411. As such, clock rate detection circuit 1500 may be readily integrated as part of circuit 1400 without excessive overhead, while providing effective detection of an abnormal clock rate that may affect the operations of circuit 1400.

Clock rate detection circuit 1500 may include, in some embodiments, a sample-and-hold circuit 1454A implemented in a similar manner as sample-and-hold circuit 1454, but adapted to receive a reference signal 1580. Reference signal 1580 may be provided by a reference signal generator 1520, which in some embodiments may be adapted to generate, regulate, and/or maintain (e.g., hold at a substantially stable level) a specified voltage to be utilized as reference signal 1580. In some embodiments, reference signal generator 1520 may be adapted to provide reference signal 1580 using a regulated voltage provided from LDO 1420.

As shown, reference signal 1580 in some embodiments may be provided to sample-and-hold circuit 1454A via a multiplexer 1586. In some embodiments, multiplexer 1586 may be adapted to receive and selectively provide reference signal 1580 or at least one other signal 1584 based on a selection input. For example, other signal 1585 may be selected at multiplexer 1586 so as to be converted into a digital value or otherwise processed by circuit 1400 including clock detection circuit 1500, while reference signal 1580 may be selected so as to be utilized to detect abnormal clock rates as further described herein. In this regard, reference signal 1580 may be selected periodically or when desired to detect abnormal clock rates, according to some embodiments.

In various embodiments, clock rate detection circuit 1500 may include a comparator 1456A implemented in a similar manner as comparator 1456, but adapted to receive a voltage from sample-and-hold circuit 1454A that may be holding reference signal 1580. In various embodiments, comparator 1456A may be adapted to also receive a ramp signal from ramp generator 1458 to compare ramp signal 1459 against the voltage (e.g., a specified voltage associated with reference signal 1580) received from sample-and-hold circuit 1454A.

As described above with respect to FIG. 14, ramp generator 1458 may be adapted to generate a ramp signal having a slope (e.g., a rate of change or ramp rate) that does not rely on (e.g., is independent of) clock signal 1470. In some embodiments, the interval between resets may be synchronized with counter 1460 as described above. Optionally in some embodiments, a level shift buffer 1555 may be provided and utilized (e.g., selectively engaged or bypassed) to adjust an offset (e.g., voltage) of ramp signal 1459 to provide an offset-adjusted ramp signal 1556 to comparator 1456A as desired. In some embodiments, the optional level shift buffer 1555 may be global to circuit 1400 (e.g., provided for ramp generator 1458 rather than being replicated for comparators 1456 and comparator 1456A).

Since the ramp signal may be independent of clock signal 1470, and reference signal 1580 may include a voltage regulated to a specified level, the ramp signal may reach (e.g., rise to a substantially equal voltage level as) reference signal 1580 after a certain fixed duration of time (e.g., within a certain range) regardless of clock signal 1470. Thus, comparator 1456A may trigger at a substantially similar time (e.g., within a certain range of time) after the ramp signal starts ramping for each cycle (e.g., after each saw tooth of the saw tooth ramp signal starts), regardless of clock signal 1470.

In contrast, as discussed above, counter 1460 may increment or decrement a count value in response to clock signal 1470, and thus the rate at which the count value is incremented or decremented may vary as the clock rate of clock signal 1470 varies. Therefore, for example, the current count value selected when comparator 1456A triggers may vary depending on the clock rate of clock signal 1470. The selected count value (e.g., also referred to as a reference voltage count 1566) may be transferred to and/or stored in latches 1464A (through switches 1462A and capacitors 1463A) as a digital value corresponding to reference signal 1580, according to some embodiments. In some embodiments, the selected count value stored in latches 1464A may be multiplexed into a digital output signal 1411A (e.g., which may also include digital output values corresponding to the IR radiation received at infrared sensors 132 and/or an ambient temperature reading by temperature sensor 1448).

In various embodiments, clock rate detection circuit 1500 may include a processing module 1565 adapted to receive reference voltage count 1566 (e.g., through digital output signal 1411A in some embodiments) and to determine, based on reference voltage count 1566, whether the clock rate of clock signal 1470 is within an expected range or not. In some embodiments, processing module 1565 may be implemented using processing module 165 described above with respect to FIGS. 3 and 4. In other embodiments, processing module 1565 may be implemented using suitable hardware and/or software logic as part of infrared sensor module 128. In some embodiments, processing module 1565 may be configured (e.g., in hardware and/or software) to determine whether the clock rate is within a normal range by checking whether reference voltage count 1566 falls within an expected range of counts. For example, if the clock rate of clock signal 1470 falls outside an expected range (e.g., outside a tolerance range for the clock rate), reference voltage count 1566 may be higher or lower than a certain expected range of counts, according to some embodiments.

Thus, for example, the detection of reference voltage count 1566 being outside the expected range may indicate an abnormal clock rate.

In some embodiments, processing module 1565 may be further adapted to compensate for temperature variations that may affect operating characteristics of various components (e.g., level shift buffer 1555, ramp generator 1458, and/or comparator 1456A) associated with clock rate detection circuit 1500. In this regard, processing module 1565 in some embodiments may be adapted to receive a temperature reading provided by temperature sensor 1468 (e.g., included in digital output signal 1411A), and to determine whether reference voltage count 1566 is within an expected range for the given temperature reading. That is, for some embodiments, the expected range of reference voltage count 1566 corresponding to reference signal 1580 may change depending on a temperature associated with various components of infrared sensor assembly 128 and/or clock rate detection circuit 1500 (e.g., level shift buffer 1555, ramp generator 1458, comparator 1456A, and/or others), and thus processing module 1565 may be adapted to account for the varying ranges of acceptable counts when determining whether the clock rate of clock signal 1470 is within an expected normal range or not.

For example, in one embodiment, processing module 1565 may be adapted to access a lookup table using the temperature reading to determine an expected range of counts for the given temperature. In another embodiment, processing module 1565 may be adapted to interpolate and/or extrapolate (e.g., using a line/curve formula, Lagrange coefficients, and/or other suitable methods) an expected range of counts for the given temperature. In these examples, the lookup table, formula, and/or coefficients may be determined during a calibration procedure for infrared sensor assembly 128 or infrared sensor module 100, and stored in a memory accessible by processing module 1565, according to some embodiments.

In place of or in addition to having processing module 1565 compensate for the temperature variations, clock rate detection circuit 1500 according to some embodiments may be configured to provide reference voltage count 1566 that is substantially or sufficiently stable over varying temperature (e.g., variance of reference voltage count 1566 due to temperature change is within a predetermined tolerance or otherwise negligible over a predetermined temperature range). For example, clock rate detection circuit 1500 according to such embodiments may include one or more components that substantially cancel out temperature-dependent variations of one or more signals (e.g., intermediate signals) generated, output, or utilized by various components of clock rate detection circuit 1500, such as offset-adjusted ramp signal 1556 output by level shift buffer 1555 and provided to comparator 1456A, ramp signal 1459 generated by ramp generator 1458, and/or reference signal 1580 generated by reference signal generator 1520. By canceling out temperature-dependent variations in one or more of such signals, reference voltage count 1566 provided by clock rate detection circuit 1500 may remain substantially stable at least over some desired temperature range, for example.

In this regard, according to one embodiment, clock rate detection circuit 1500 may include a second level shift buffer 1557 in a signal path between reference signal generator 1520 and comparator 1456A (e.g., between reference signal generator 1520 and multiplexer 1586, between multiplexer 1586 and sample-and-hold circuit 1454A, between sample-and-hold circuit 1454A and comparator 1456A, or in other appropriate locations along the signal path between reference signal generator 1520 and comparator 1454A). Level shift buffer 1557 is implemented in a similar manner as level shift buffer 1555, such that level shift buffer 1557 exhibits similar temperature-dependent characteristics (e.g., similar temperature-dependent variations in the shifted output signal) as level shift buffer 1555. Accordingly, the temperature-dependent variations due to level shift buffer 1555 at one input of comparator 1454A may effectively be canceled out by the temperature-dependent variations due to level shift buffer 1557 at the other input of comparator 1454A. Also in this embodiment, reference signal 1580 may be lower or higher than a reference signal in embodiments without level shift buffer 1557, such that reference signal 1580 after offset adjustment by level shift buffer 1557 may exhibit a similar voltage level as in embodiment without level shift buffer 1557. In one example, level shift buffer 1557 may add approximately 0.6 volts of offset adjustment, and reference signal 1580 provided by reference signal generator 1520 may be 0.6 volts lower than a nominal case that does not include level shift buffer 1557.

Using matched (e.g., paired) level shift buffers 1555 and 1557 in this way to cancel temperature-dependent variations of inputs to comparator 1456 may be effective in providing temperature-stable reference voltage count 1566, for example, when level shift buffer 1555 exhibits non-negligible temperature-dependent variations in its output signal. As may be appreciated, for other embodiments, other components of clock rate detection circuit 1500 may additionally or alternatively be provided as matched pairs in a similar manner to cancel out temperature-dependent variations in those components. For example, in some embodiments, buffers or other analog components (e.g., for generating or passing analog signals) other than level shift buffers 1555 and 1557 may be provided as a matched pair, one of the pair in the signal path between reference signal generator 1520 and one input of comparator 1456A and the other of the pair in the signal path between ramp generator 1458 and the other input of comparator 1456A.

In some embodiments, clock rate detection circuit 1500 may be adapted to disable (e.g., shut off or otherwise prevent from generating digital outputs corresponding to IR radiation detected at infrared sensors 132) infrared sensor assembly 128, if it is determined that the clock rate of clock signal 1470 is outside the expected normal range. For example, in some embodiments, processing module 1565 may be adapted to cause (e.g., via appropriate control signals and/or timing control circuitry 1404) switching circuitry 1370 to disengage relevant infrared sensors 132 (e.g., active bolometers normally utilized in generating infrared image frames) upon determining that the clock rate of clock signal 1470 is outside the expected normal range. In other examples, processing module 1565 may be adapted to cause the power to infrared sensor assembly 128 to be shut off (e.g., by shutting off a supply of voltage from LDO 1420 or from other sources), or otherwise disable or disengage any appropriate component or components of infrared sensor assembly 128 (e.g., to completely disable, reduce the frame rate, or drop image frames), upon determining that the clock rate of clock signal 1470 is outside the expected range.

Therefore, for example, clock rate detection circuit 1500 may effectively ensure that clock signal 1470 provided to infrared sensor assembly 128 has a clock rate within an expected normal range. This may in turn ensure that infrared sensor assembly 128 generates infrared image frames having a set frame rate, ensure that other operations of infrared sensor assembly 128 are within specified parameters, and/or prevent failure of components of infrared sensor assembly 128.

Although clock rate detection circuit 1500 may be described above with respect to circuit 1400 associated with infrared sensor assembly 128, it is also contemplated that clock rate detection circuit 1500 may be modified for application to other imaging sensor arrays or assemblies, including, for example, those adapted to capture visible light images (e.g., CMOS-based or CCD-based sensors) or electromagnetic radiation in other wavelengths. Further, clock rate detection circuit 1500 may be suitably modified for application more generally to various other integrated circuits (e.g., processors, memory devices, controllers, signal processors, or other integrate circuit chips or assemblies) without departing from the scope and spirit of the disclosure, for example, by providing a ramp generator, a counter, and/or other components associated with clock detection circuit 1500 if not present.

Figure 16:
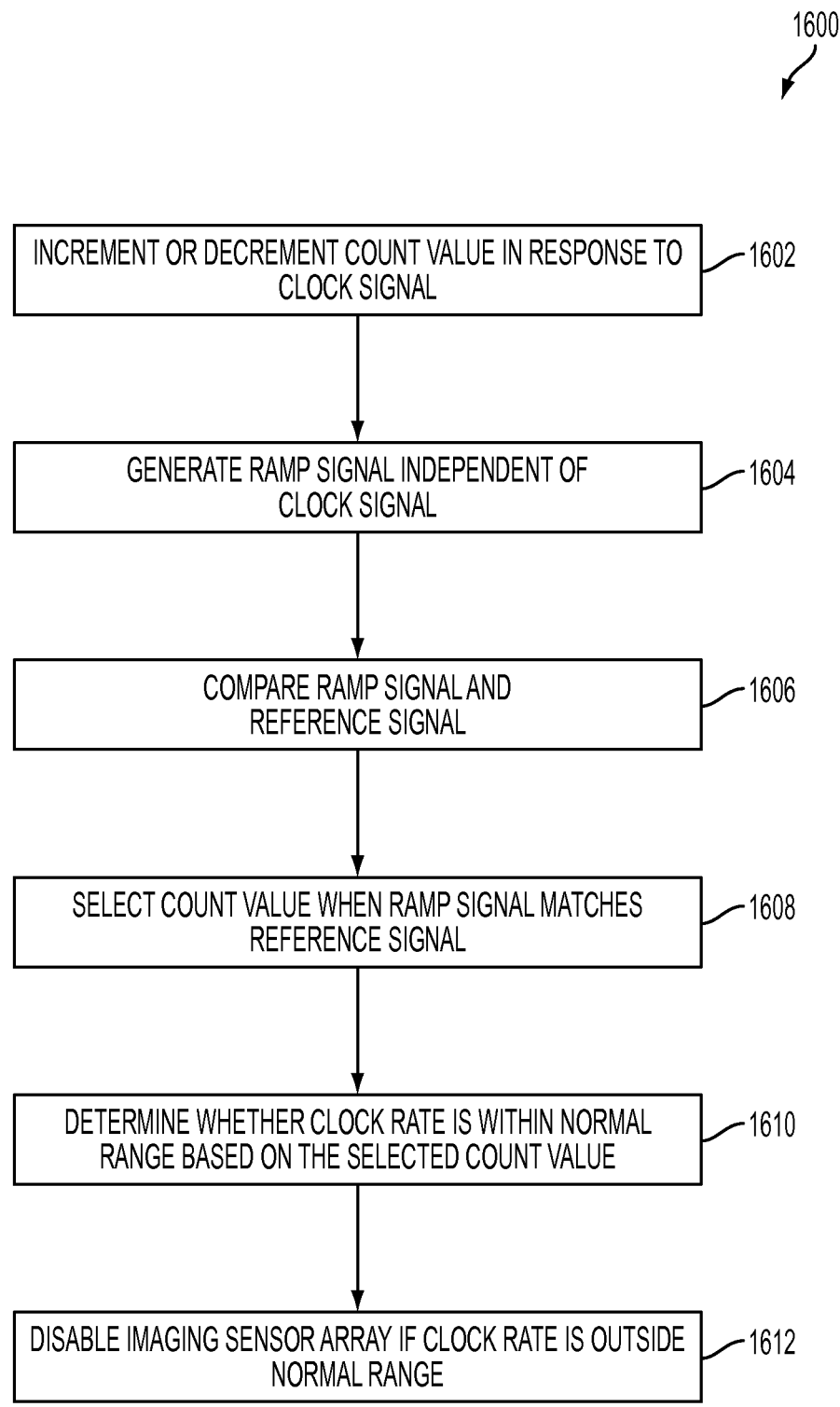
FIG. 16 illustrates a flowchart of a process to detect an abnormal clock rate provided to an infrared sensor assembly in accordance with an embodiment of the disclosure.

Referring now to FIG. 16, a process 1600 to detect an abnormal clock rate is illustrated in accordance with an embodiment of the disclosure. For example, all or part of process 1600 may be performed using various components associated with clock rate detection circuit 1500 described above or other suitable components to determine whether clock signal 1470 has a clock rate within an expected range or not. At block 1602, a count value may be adjusted (e.g., incremented or decremented) in response to clock signal 1470. For example, the count value may be incremented or decremented once every clock pulse, twice every clock pulse (e.g., at a rising edge and a falling edge of every clock pulse), or many times as desired (e.g., by appropriately dividing clock signal 1470) using one or more implementations of counter 1460. As described above with respect to FIGS. 14 and 15, the incremented or decremented count value may also be provided to channel circuitry portion 1402 and/or other components of infrared sensor assembly 128.

At block 1604, a ramp signal may be generated independent of clock signal 1470, as described above with respect to ramp generator 1458 of FIGS. 14 and 15. As described above, the generated ramp signal may also be provided to comparator 1456 of circuit 1400 and/or other components of infrared sensor assembly 128.

At block 1606, the ramp signal may be compared against reference signal 1580 using, for example, comparator 1465A. In this regard, operations of block 1606 may include, for some embodiments, generating reference signal 1580 (e.g., to have a specified voltage) using reference signal generator 1520 or other suitable circuit/component, and providing the generated reference signal 1580 to comparator 1465A for comparison with the ramp signal.

At block 1608, the current count value of counter 1460 may be selected when the ramp signal matches (e.g., is at substantially the same level as) reference signal 1580 as described. In some embodiments, a temperature reading from temperature sensor 1468 may also be multiplexed into digital output signal 1411A as described above.

At block 1610, based on the selected count value, it may be determined whether the clock rate of clock signal 1470 is within an expected normal range or not. As discussed above, in some embodiments, block 1610 may involve determining whether the selected count value falls within an expected range of counts for reference signal 1580. In some embodiments, block 1610 may also include compensating for a temperature variation that may cause a variation in the expected range of counts for reference signal 1580.

At block 1612, infrared sensor assembly 128 may be disabled based on a determination that clock signal 1470 provided to infrared sensor assembly 128 has a clock rate outside an expected normal range as describe. As discussed above, if process 1600 is utilized to detect an abnormal clock rate of any other clock signal provided to a device other than infrared sensor assembly 128 (e.g., other types of imaging sensor array or other integrated circuit chips), any such other device may be disabled at block 1612.

Accordingly, by performing one or more embodiments of process 1600, abnormal clock rates may be detected if such clock rates are used by imaging sensor devices or other devices. Further, if abnormal clock rates are detected, corrective actions (e.g., disabling the imaging sensor devices, reducing frame rates, and/or dropping image frames) may be taken so as to ensure various operating parameters (e.g., including the frame rate) are within specified ranges and/or to prevent failure of components.

In some embodiments, temperature sensor 1468 may be implemented to convert an analog signal (e.g., an analog temperature-dependent voltage, current, and/or other parameter) to a digital temperature value in a manner that shares one or more components used to perform A/D conversion operations previously described herein.

For example, as shown in FIGS. 14-15, temperature sensor 1468 receives the count value provided by counter 1460 and the signal provided by ramp generator 1458. Although the ramp generator signal is illustrated as being provided to temperature sensor 1468 prior to level shift buffer 1555, a buffered signal may be provided to temperature sensor 1468 in other embodiments.

Figure 17:
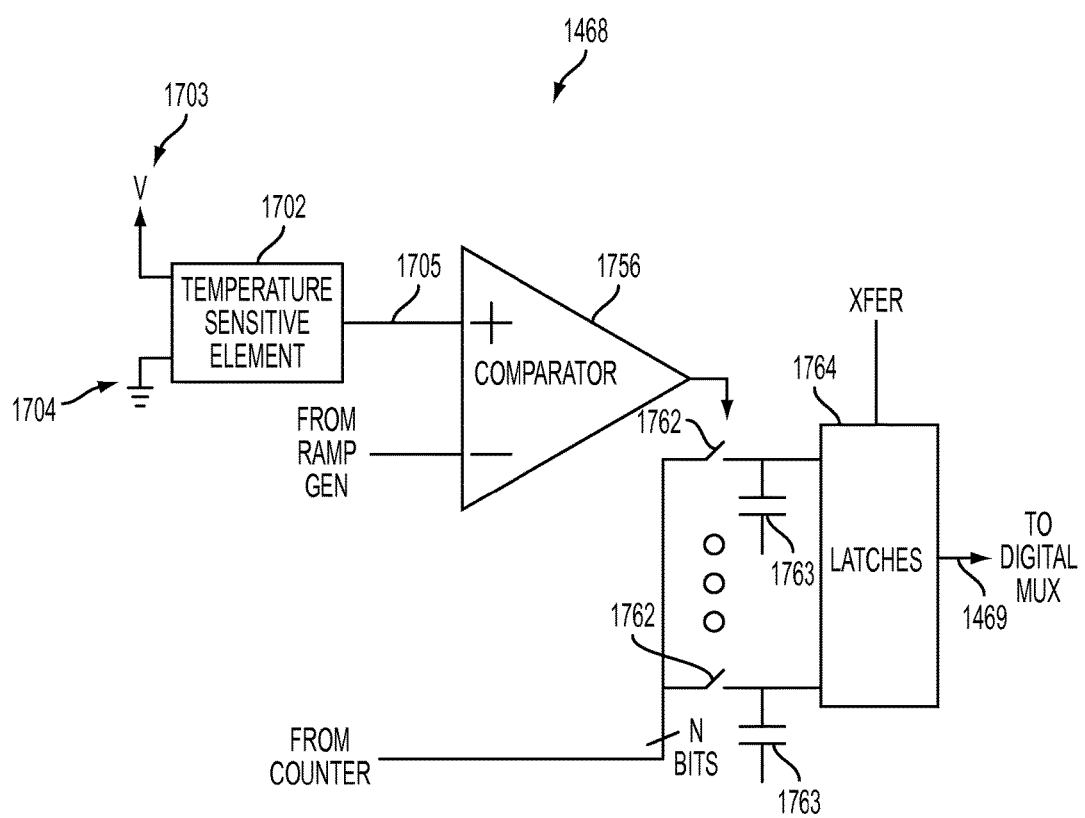
FIG. 17 illustrates a schematic diagram of a temperature sensor circuit in accordance with an embodiment of the disclosure.

FIG. 17 illustrates a schematic diagram of temperature sensor 1468 in accordance with an embodiment of the disclosure. As shown in FIG. 17, temperature sensor 1468 may include a temperature sensitive element 1702, a comparator 1756, switches 1762, capacitors 1763, and latches 1764.

Temperature sensitive element 1702 may be implemented by any appropriate circuit configured to provide a temperature-dependent analog signal 1705 (e.g., a temperature-sensitive diode, a thermistor, a resistance temperature detector, and/or other temperature-sensitive circuits).

For example, in some embodiments, temperature sensitive element 1702 may be connected to a supply voltage 1703 and a ground 1704, and may provide temperature-dependent analog signal 1705 as a voltage in a range from ground to the supply voltage in response to temperature changes. In some embodiments, other voltages may be used (e.g., positive, negative, or bipolar voltages may be provided to or by temperature sensitive element 1702). In some embodiments, lower voltages provided by temperature sensitive element 1702 may be associated with higher temperatures. In some embodiments, higher voltages provided by temperature sensitive element 1702 may be associated with higher temperatures.

Comparator 1756 receives temperature-dependent analog signal 1705 from temperature sensitive element 1702, and also receives the ramp signal from ramp generator 1458. Switches 1762 receive the count value from counter 1460 and may be triggered to capture the current count value as a temperature count 1469 at capacitors 1763 for storage in latches 1764. In this regard, comparator 1756 may trigger switches 1762 when the ramp signal substantially matches temperature-dependent analog signal 1705.

Thus, the temperature count 1469 stored in latches 1764 may be dependent on the temperature of temperature sensitive element 1702 and corresponds to a temperature reading (e.g., an ambient or other temperature reading). This temperature count 1469 may be provided to multiplexer 1406 and multiplexed into digital output signal 1411 as discussed.

Although comparator 1456A (FIG. 15) and comparator 1756 (FIG. 17) may receive count values from counter 1460 and the ramp signal from ramp generator 1456, comparators 1456A and 1756 may trigger at different times and thus store different count values. For example, as discussed, comparator 1456A triggers switches 1462A to store the current count value as reference voltage count 1566 when the ramp signal substantially matches the voltage of reference signal 1580. In contrast, comparator 1756 triggers switches 1762 to store a different current count value as temperature count 1469 when the ramp signal substantially matches the voltage provided by temperature sensitive element 1702. In some embodiments, comparators 1456A and 1756 may trigger at times that are the same or substantially the same (e.g., if reference signal 1580 is the same or substantially the same voltage as temperature-dependent analog signal 1705).

As discussed, processing module 1565 may receive reference voltage count 1566 and temperature count 1469 to determine whether reference voltage count 1566 is within an expected range for the temperature associated with temperature count 1469. That is, if reference voltage count 1566 is within a range of count values selected based on the value of temperature count 1469, then processing module 1565 may interpret this fact as clock signal 1470 operating at a normal (e.g., acceptable) rate. Conversely, if reference voltage count 1566 is outside the range of count values selected based on the value of temperature count 1469, then processing module 1565 may interpret this fact as clock signal 1470 operating at an abnormal (e.g., unacceptable) rate.

For example, in some embodiments, ramp generator 1458 and/or other components may be expected to operate more rapidly at higher temperatures. Thus, processing module 1565 may identify various maximum and/or minimum threshold values for the acceptable range of reference voltage count 1566 depending on the value of temperature count 1469. For example, in some embodiments, the maximum and minimum threshold values for the acceptable range of reference voltage count 1566 may be greater (e.g., increased) in the case of high temperature readings, and may be lesser (e.g., reduced) in the case of low temperature readings.

Although temperature count 1469 may generally correlate to the temperature at temperature sensitive element 1702, it may also be affected by variations in clock signal 1470 and/or other factors. For example, as discussed, counter 1460 may increment or decrement a count value in response to clock signal 1470, and thus the rate at which the count value is incremented or decremented may vary as the clock rate of clock signal 1470 varies. Therefore, in embodiments where counter 1460 increments its count value over time, counter 1460 will count more rapidly if clock signal 1470 runs at an abnormally high rate, thus causing latches 1764 to store an abnormally high value for temperature count 1469.

In some embodiments, the value of temperature count 1469 may be inversely related to temperature. For example, in some embodiments as discussed, lower voltages provided by temperature sensitive element 1702 may be associated with higher temperatures. Accordingly, temperature count 1469 may exhibit low count values for high temperatures, and high count values for low temperatures in such embodiments.

Also in such embodiments, if clock signal 1460 runs at an abnormally high rate, both reference voltage count 1566 and temperature count 1469 will exhibit abnormally high values. However, in such embodiments, high values for temperature count 1469 may be interpreted by processing module 1565 as actually being associated with lower temperatures.

As discussed, processing module 1565 may utilize reduced threshold values for reference voltage count 1566 if lower temperatures are sensed (e.g., if higher values of temperature count 1469 are received).

In such cases, as the rate of clock signal 1470 increases, reference voltage count 1566 may exhibit higher values, but the lower detected temperature (e.g., due to temperature count 1469 being driven higher by the higher clock rate) may cause processing module 1565 to actually utilize a reduced maximum threshold for expected normal rates of clock signal 1470. As a result, processing module 1565 may rapidly detect increases in the rate of clock signal 1470 as the reference voltage count quickly exceeds the decreasing maximum threshold for expected normal rates of clock signal 1470. Upon rapid detection, corrective action may be taken in accordance with the various techniques discussed.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A device comprising:
   a counter configured to receive a clock signal and adjust a count value in response to the clock signal;
   a ramp generator configured to generate a ramp signal;
   a first comparator configured to receive a reference signal via a first input and the ramp signal via a second input, and select a first count value of the counter at a first time in response to the reference signal and the ramp signal;
   a temperature sensor configured to detect a temperature associated with the device and provide a temperature-dependent analog signal;
   a second comparator configured to receive the temperature-dependent analog signal and the ramp signal, and select a second count value of the counter at a second time in response to the temperature-dependent analog signal and the ramp signal; and a processor configured to determine a predetermined range for the detected temperature based on the second count value such that a maximum of the predetermined range used by the processor decreases as a frequency of the clock signal increases, and determine if the frequency of the clock signal is within a specified range based on whether the first count value is within the predetermined range for the detected temperature.

2. The device of claim 1, wherein the reference signal and the ramp signal received at the first comparator exhibit similar variations over temperature such that the first count value selected by the first comparator is substantially stable over temperature for a given frequency of the clock signal.

3. The device of claim 2, further comprising:
a reference signal generator configured to generate the reference signal that is independent of the clock signal;
a first analog component provided in a signal path between the reference signal generator and the first input of the first comparator to pass and/or adjust the reference signal to the first comparator; and
a second analog component provided in a signal path between the ramp generator and the second input of the first comparator to pass and/or adjust the ramp signal to the first comparator,
wherein the first and the second analog components are matched with respect to temperature-dependent variations to provide the reference signal and the ramp signal that exhibit similar temperature-dependent variations.

4. The device of claim 3, wherein the first and the second analog components comprise a matched pair of first and second buffers.

5. The device of claim 4, wherein the first and the second buffers are level shift buffers.

6. A method comprising:
adjusting a count value in response to a clock signal, wherein the clock signal is provided to a device;
generating a ramp signal;
comparing the ramp signal with a reference signal;
selecting a first count value of the count value at a first time in response to the comparing of the ramp signal with the reference signal; and
detecting a temperature associated with the device;
providing a temperature-dependent analog signal indicative of the temperature associated with the device;
comparing the ramp signal with the temperature-dependent analog signal;
selecting a second count value of the count value at a second time in response to the comparing of the ramp signal with the temperature-dependent analog signal;
determining a predetermined range for the detected temperature based on the second count value such that a maximum of the predetermined range for the detected temperature decreases as a frequency of the clock signal increases; and
determining if the frequency of the clock signal is within a specified range based on whether the first count value is within the predetermined range for the detected temperature.

7. The method of claim 6, wherein the reference signal and the ramp signal exhibit similar variations over temperature such that the selecting of the first count value is substantially stable over temperature for a given frequency of the clock signal.

8. The method of claim 7, further comprising:
passing and/or adjusting the reference signal by a first analog component prior to the selecting of the first count value; and
passing and/or adjusting the ramp signal by a second analog component prior to the selecting of the first count value,
wherein the first and the second analog components are provided as a matched pair configured to exhibit similar temperature-dependent variations in the reference signal and the ramp signal.

9. The method of claim 8, wherein:
the matched pair comprises a matched pair of first and second buffers;
the passing and/or adjusting of the reference signal comprises buffering the reference signal by the first buffer; and
the passing and/or adjusting of the ramp signal comprises buffering the ramp signal by the second buffer.

10. The method of claim 9, wherein:
the first and the second buffers are level shift buffers;
the buffering of the reference signal comprises shifting the reference signal by a predetermined level; and
the buffering of the ramp signal comprises shifting the ramp signal by the predetermined level.

11. The device of claim 1, wherein:
the ramp signal ramps up or down with a rate of change independent of the clock signal; and
the first comparator is configured to select the first count value of the counter in response to the ramp signal reaching a substantially same level as the reference signal.

12. The device of claim 1, further comprising an infrared imaging sensor array configured to receive the clock signal, wherein the infrared imaging sensor array is configured to provide infrared images at a frame rate dependent on the frequency of the clock signal.

13. The device of claim 12, wherein the processor is configured to reduce the frame rate, drop image frames, and/or disable at least a portion of the device if the frequency of the clock signal is outside the specified range.

14. The method of claim 6, wherein:
the ramp signal ramps up or down with a rate of change independent of the clock signal; and
the selecting of the first count value in response to the comparing of the ramp signal with the reference signal comprises selecting the first count value in response to the ramp signal reaching a substantially same level as the reference signal.

15. The method of claim 6, further comprising:
receiving, by an infrared imaging sensor array, the clock signal; and
providing, by the infrared imaging sensor array, infrared images at a frame rate dependent on the frequency of the clock signal.

16. The method of claim 15, further comprising performing a corrective action to reduce the frame rate, drop image frames, and/or disable at least a portion of the infrared imaging sensor array if the frequency of the clock signal is outside the specified range.

* * * * *

UNITED STATES PATENT AND TRADEMARK OFFICE
CERTIFICATE OF CORRECTION

Page 1 of 1

PATENT NO. : 9,948,878 B2
APPLICATION NO. : 14/961829
DATED : April 17, 2018
INVENTOR(S) : Brian Simolon et al.

It is certified that error appears in the above-identified patent and that said Letters Patent is hereby corrected as shown below:

In the Specification

Column 17, Line 51, change "$NUC_{NEW}=\lambda 19NUC_{OLD}$" to --$NUC_{NEW}=\lambda \cdot 19NUC_{OLD}$--.

Column 24, Line 11, change "LDO 122.0" to --LDO 1220--.

Signed and Sealed this
Tenth Day of July, 2018

Andrei Iancu
*Director of the United States Patent and Trademark Office*